(12) United States Patent
Takashita et al.

(10) Patent No.: US 9,082,825 B2
(45) Date of Patent: Jul. 14, 2015

(54) MANUFACTURING METHOD FOR SEMICONDUCTOR PACKAGE, SEMICONDUCTOR PACKAGE, AND SEMICONDUCTOR DEVICE

(71) Applicant: PANASONIC CORPORATION, Osaka (JP)

(72) Inventors: Hiromitsu Takashita, Osaka (JP); Tsuyoshi Takeda, Osaka (JP); Keiko Kashihara, Osaka (JP); Hiroaki Fujiwara, Nara (JP); Shingo Yoshioka, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 14/235,766

(22) PCT Filed: Oct. 18, 2012

(86) PCT No.: PCT/JP2012/006675
§ 371 (c)(1),
(2) Date: Jan. 28, 2014

(87) PCT Pub. No.: WO2013/057949
PCT Pub. Date: Apr. 25, 2013

(65) Prior Publication Data
US 2014/0191406 A1   Jul. 10, 2014

(30) Foreign Application Priority Data

Oct. 19, 2011 (JP) ................. 2011-229496
Nov. 8, 2011 (JP) ................. 2011-244785
Nov. 8, 2011 (JP) ................. 2011-244786

(51) Int. Cl.
*H01L 21/00* (2006.01)
*H01L 21/768* (2006.01)
(Continued)

(52) U.S. Cl.
CPC .......... *H01L 21/76877* (2013.01); *H01L 21/56* (2013.01); *H01L 21/561* (2013.01);
(Continued)

(58) Field of Classification Search
USPC ................................. 438/106–127
See application file for complete search history.

(56) References Cited

U.S. PATENT DOCUMENTS

| 5,556,812 A | 9/1996 | Leuschner et al. |
| 2006/0258056 A1 | 11/2006 | Bauer |

(Continued)

FOREIGN PATENT DOCUMENTS

| EP | 0 690 494 A2 | 1/1996 |
| JP | 2005-197273 A | 7/2005 |

(Continued)

OTHER PUBLICATIONS

International Search Report issued in International Application No. PCT/JP2012/006675 with Date of mailing Sep. 3, 2013.

*Primary Examiner* — Karen Kusumakar
(74) *Attorney, Agent, or Firm* — McDermott Will & Emery LLP

(57) ABSTRACT

One aspect of the present invention resides in a manufacturing method for a semiconductor package, including a covering step of forming a covering insulating layer that covers the surface of a semiconductor element, a film-forming step of forming a resin film on the surface of the covering insulating layer, a circuit pattern-forming step of forming a circuit pattern portion including recesses reaching the surfaces of electrodes of the semiconductor element and a circuit groove having a desired shape and a desired depth, a catalyst-depositing step of depositing a plating catalyst or a precursor thereof on the surface of the circuit pattern portion, a film-separating step of separating the resin film from the covering insulating layer, and a plating processing step of forming a circuit electrically connected to the electrodes, by applying electroless plating to the covering insulating layer, from which the resin film is separated.

19 Claims, 6 Drawing Sheets

(51) Int. Cl.
*H01L 21/56* (2006.01)
*H01L 23/31* (2006.01)
*H01L 23/538* (2006.01)
*H01L 23/498* (2006.01)
*H01L 23/48* (2006.01)
*H01L 23/00* (2006.01)

(52) U.S. Cl.
CPC .......... *H01L21/568* (2013.01); *H01L 23/3114* (2013.01); *H01L 23/481* (2013.01); *H01L 23/49816* (2013.01); *H01L 23/5389* (2013.01); *H01L 24/03* (2013.01); *H01L 24/96* (2013.01); *H01L 24/05* (2013.01); *H01L 24/11* (2013.01); *H01L 24/13* (2013.01); *H01L 2224/0236* (2013.01); *H01L 2224/02311* (2013.01); *H01L 2224/02379* (2013.01); *H01L 2224/033* (2013.01); *H01L 2224/0347* (2013.01); *H01L 2224/03464* (2013.01); *H01L 2224/0401* (2013.01); *H01L 2224/04105* (2013.01); *H01L 2224/05548* (2013.01); *H01L 2224/12105* (2013.01); *H01L 2224/131* (2013.01); *H01L 2224/13022* (2013.01); *H01L 2224/13023* (2013.01); *H01L 2224/13024* (2013.01); *H01L 2224/1411* (2013.01); *H01L 2224/19* (2013.01); *H01L 2224/2101* (2013.01); *H01L 2224/2105* (2013.01); *H01L 2224/96* (2013.01); *H01L 2924/0001* (2013.01)

(56) References Cited

U.S. PATENT DOCUMENTS

2008/0315391 A1* 12/2008 Kohl et al. ............... 257/690
2009/0152715 A1*  6/2009 Shim et al. ............... 257/737
2011/0198762 A1    8/2011 Scanlan

FOREIGN PATENT DOCUMENTS

JP      2005-353837 A   12/2005
WO        02/15266  A2    2/2002
WO      2004/070769 A2    8/2004

* cited by examiner

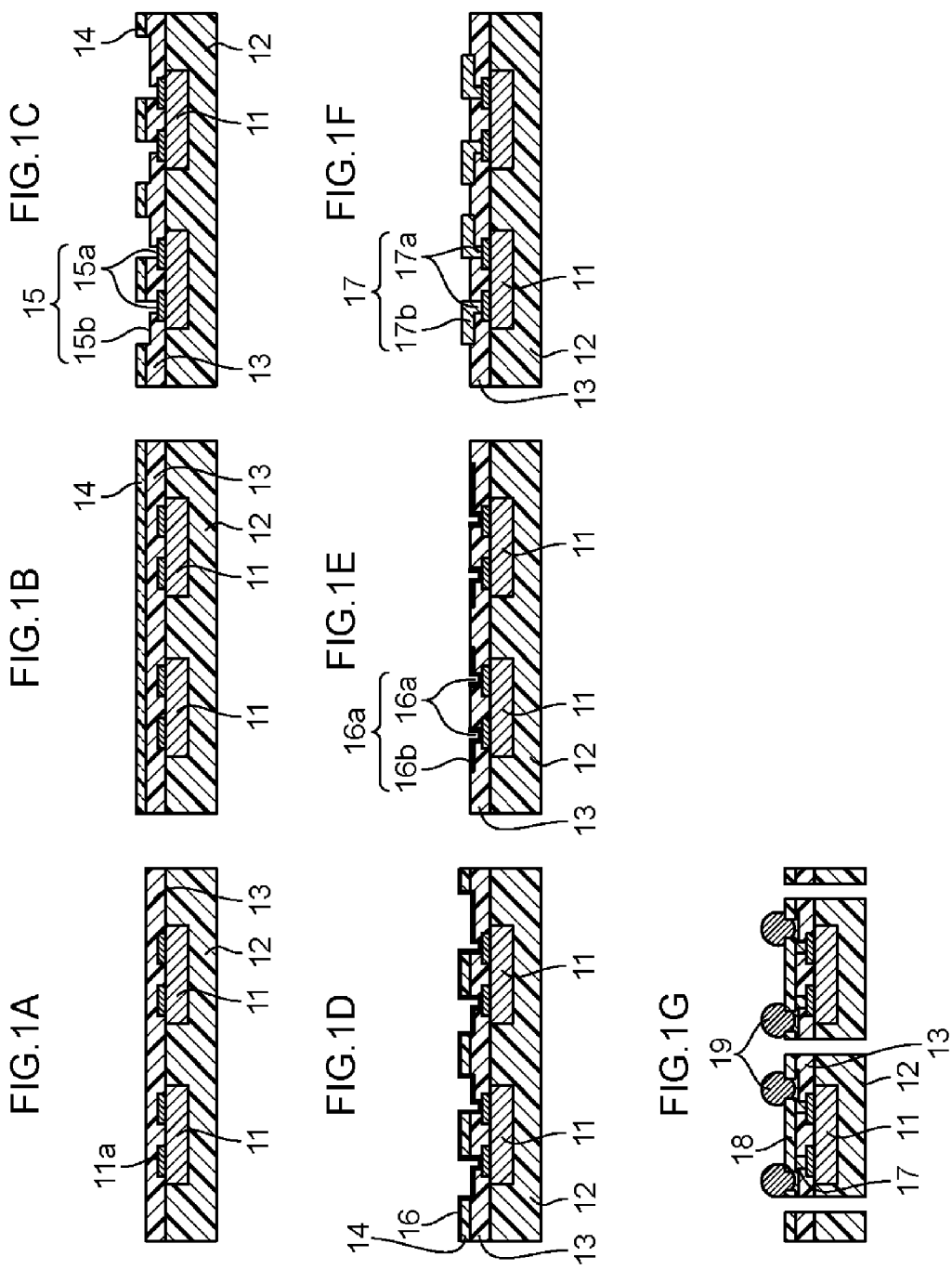

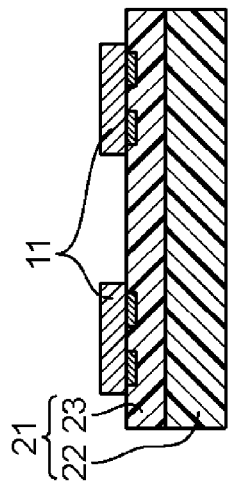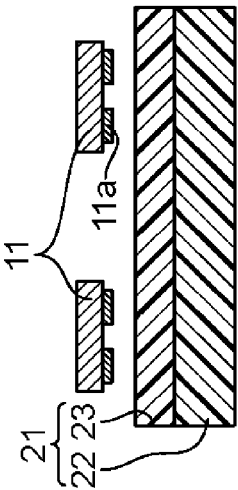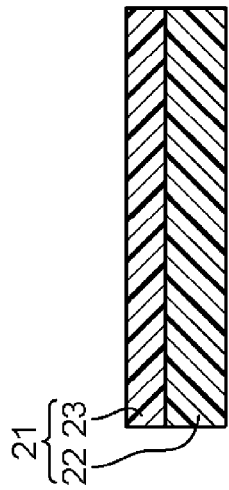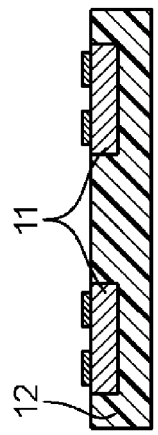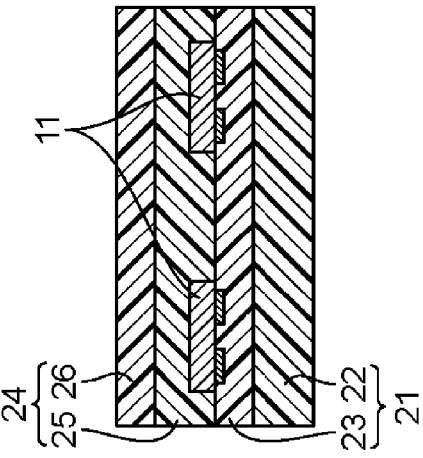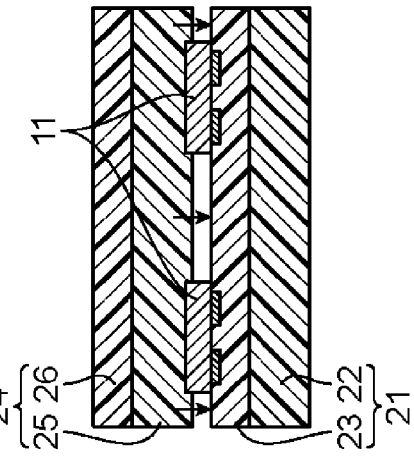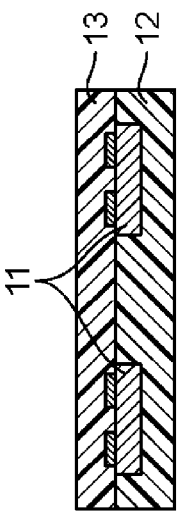

[Fig. 4]

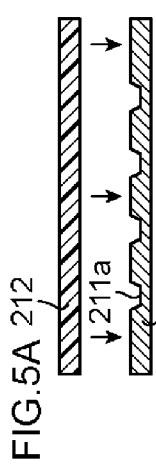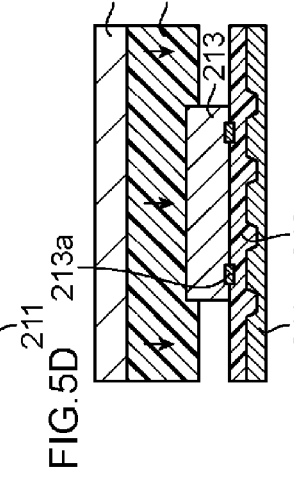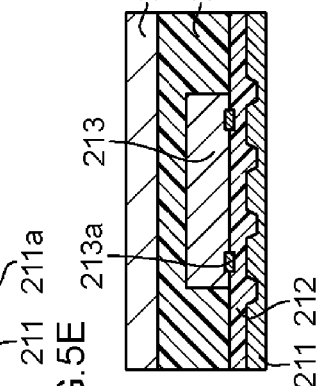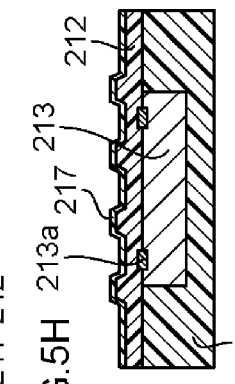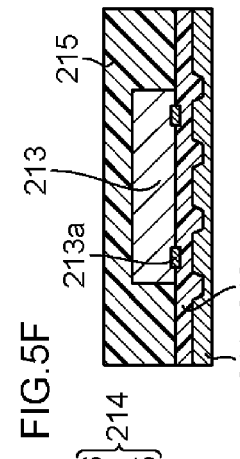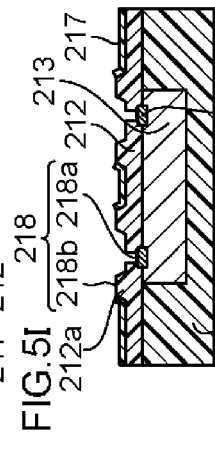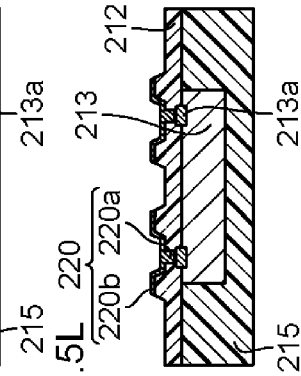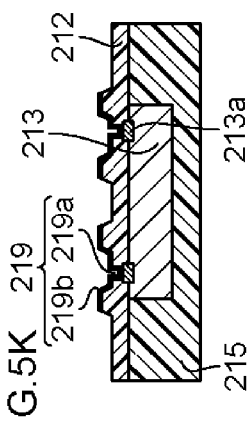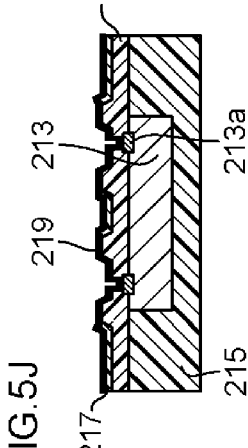

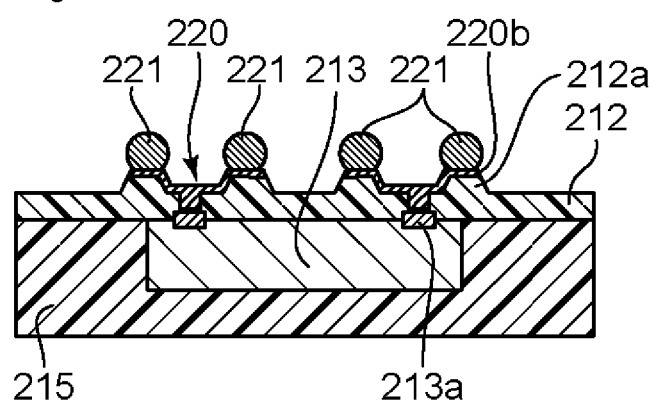

MANUFACTURING METHOD FOR SEMICONDUCTOR PACKAGE, SEMICONDUCTOR PACKAGE, AND SEMICONDUCTOR DEVICE

RELATED APPLICATIONS

This application is a national phase application of the U.S. National Phase under 35 U.S.C. §371 of International Application No. PCT/JP2012/006675, filed on Oct. 18, 2012, which in turn claims the benefit of Japanese Application No. 2011-229496, filed on Oct. 19, 2011, Japanese Application No. 2011-244785, filed on Nov. 8, 2011, and Japanese Application No. 2011-244786, filed on Nov. 8, 2011, the disclosures of which Applications are incorporated by reference herein.

TECHNICAL FIELD

The present invention relates to a manufacturing method for a semiconductor package, a semiconductor package obtained by the manufacturing method, and a semiconductor device including the semiconductor package.

BACKGROUND ART

A conventional semiconductor package generally had a configuration in which electrical connection between a semiconductor element and a substrate is secured by flip-chip mounting of electrodes of the semiconductor element such as a semiconductor chip and a circuit of the substrate such as a printed wiring board via solder bumps or the like.

In the case of such a semiconductor package, in order to improve reliability of the electrical connection, it is conceivable to increase the size of the solder bumps for securing the electrical connection between the semiconductor element and the substrate. In other words, in order to improve the reliability of the electrical connection between the semiconductor element and the substrate, an amount of solder equal to or larger than a fixed amount for securing the connection is necessary. Therefore, with the refining of the semiconductor package, the following limitations are required in narrowing a pitch of the solder bumps.

Specifically, when the pitch of the solder bumps is narrowed, the solder bumps adjacent to each other tend to be coupled. Therefore, it is necessary to reduce the size of the solder bumps, i.e., reduce an amount of solder to prevent the bumps from being coupled, but as a result of which, the reliability of connection via the solder bumps is decreased. This makes it difficult to maintain the electrical connection between the substrate and the semiconductor element and decreases the reliability of the electrical connection.

Further, even when further refining of the semiconductor package is requested, in order to secure the electrical connection between the semiconductor element and the substrate, there is a limit in reducing an amount of solder. Therefore, there is a limit in reducing the size of the solder bumps.

During reflow of the flip-chip mounting, a solder bridge occurs in which the solder bumps are melted and the adjacent solder bumps are coupled. Electrical short circuit tends to occur. Therefore, there is a limit in increasing the number of solder bumps (the number of terminals) with respect to the size of a semiconductor chip.

Further, in the case of the connection by the flip-chip mounting, heat treatment at high temperature is applied during the reflow. Therefore, because of a difference in a coefficient of thermal expansion due to a member forming the semiconductor package, force is applied to the semiconductor package in a direction in which a warp occurs. A connection failure due to the occurrence of the warp also tends to occur when the pitch of the solder bumps is narrowed by the refining of the semiconductor package.

Consequently, there is a limit in the narrowing of the pitch of the solder bumps and there is a limit in the refining of the semiconductor package.

Therefore, it is conceivable to manufacture a semiconductor package with a manufacturing method for a semiconductor package other than the manufacturing method for a semiconductor package by the flip-chip mounting.

Specifically, for example, there is a manufacturing method explained below. First, an insulating layer is formed on the surface of a semiconductor element on which electrodes are formed, i.e., a circuit surface. Recesses reaching the surfaces of the electrodes of the semiconductor element are formed in the insulating layer. In other words, an inter-layer via is formed on a land of the semiconductor element. A circuit is formed on the surface of the insulating layer. Such formation of the circuit on the insulating layer is referred to as re-wiring. The circuit formed by the re-wiring is referred to as a re-wired circuit. This makes it possible to form electrical connection between the re-wired circuit and the semiconductor element via the inter-layer via.

Examples of such manufacturing method for a semiconductor package include manufacturing methods described in Patent Document 1 and Patent Document 2.

Patent Document 1 describes a manufacturing method for a semiconductor device including a first step of laminating a first insulating layer on the surface of a supporting body, a second step of machining, in the first insulating layer, a hole for connecting the first insulating layer to an electrode pad of a semiconductor chip, a third step of performing alignment to match the electrode pad of the semiconductor chip to the hole and sticking the semiconductor chip to the surface of the first insulating layer, a fourth step of laminating a second insulating layer on the first insulating layer to cover the semiconductor chip, and a fifth step of removing the supporting body from the first insulating layer.

According to Patent Document 1, it is disclosed that the hole for connecting the first insulating layer to the electrode pad of the semiconductor chip is formed in the first insulating layer and the alignment is performed to match the electrode pad of the semiconductor chip to the hole and the semiconductor chip is stuck to the surface of the first insulating layer, whereby it is possible to highly accurately perform connection between the electrode pad of the semiconductor chip and a stud via formed in the hole. It is disclosed that, consequently, since a reduction in size can be realized and improvement of chip mounting accuracy can be realized using a bare chip not subjected to re-wiring in a wafer level, it is possible to reduce manufacturing costs.

Patent Document 2 describes a manufacturing method for a semiconductor package including a step of forming an insulated bonding layer of thermoplastic resin on an interposer side by an intermediate insulating layer and a re-wiring layer formed on one side of a semiconductor, a step of forming a hole leading to the re-wiring layer in a predetermined position of the insulated bonding layer, and a step of filling a conductive material forming an electrode member in the hole.

According to Patent Document 2, it is disclosed that it is possible to obtain a semiconductor package that can be mounted without a gap between the semiconductor package and a wiring board.

CITATION LIST

Patent Literature

[PTL 1] Japanese Patent Application Laid-Open No. 2005-353837
[PTL 2] Japanese Patent Application Laid-Open No. 2005-197273

SUMMARY OF THE INVENTION

An object of the present invention is to provide a manufacturing method for a semiconductor package that can highly accurately perform the formation of a circuit on an insulating layer that covers a semiconductor element and the formation of vias for electrically connecting the circuit and electrodes of the semiconductor element, a semiconductor package obtained by the manufacturing method, and a semiconductor device including the semiconductor package.

According to an aspect of the present invention, there is provided a manufacturing method for a semiconductor package including a covering step of forming a covering insulating layer that covers the surface of a semiconductor element on which electrodes are formed, the semiconductor element including the electrodes on the principal plane thereof, a film-forming step of forming a resin film on the surface of the covering insulating layer on the electrodes side of the semiconductor element, a circuit pattern-forming step of forming a circuit pattern portion including recesses reaching the surfaces of the electrodes and a circuit groove having a desired shape and a desired depth, by applying laser processing or embossing to the covering insulating layer from an outer surface side of the resin film, a catalyst-depositing step of depositing a plating catalyst or a precursor thereof on the surface of the circuit pattern portion and the surface of the resin film, a film-separating step of separating the resin film from the covering insulating layer, and a plating processing step of forming a circuit electrically connected to the electrodes, by applying electroless plating to the covering insulating layer, from which the resin film is separated.

According to another aspect of the present invention, there is provided a semiconductor package obtained by the manufacturing method for a semiconductor package.

According to still another aspect of the present invention, there is provided a semiconductor device including the semiconductor package and one or more wiring layers including circuits electrically connected to the circuit of the semiconductor package.

Objects, characteristics, aspects, and advantages of the present invention are made apparent by the following detailed description and accompanying drawings.

BRIEF DESCRIPTION OF DRAWINGS

FIGS. 1A to 1G are schematic sectional views for explaining steps in a manufacturing method for a semiconductor package according to a second embodiment of the present invention.

FIGS. 2A to 2G are schematic sectional views for explaining an example of a covering step in the manufacturing method for a semiconductor package according to the second embodiment of the present invention.

FIGS. 5A to 5L are schematic sectional views for explaining steps in a manufacturing method for a semiconductor package according to a fourth embodiment of the present invention.

FIG. 6 is a schematic sectional view schematically showing a semiconductor package obtained by the manufacturing method for a semiconductor package according to the fourth embodiment of the present invention.

DESCRIPTION OF EMBODIMENTS

Figure 3A:
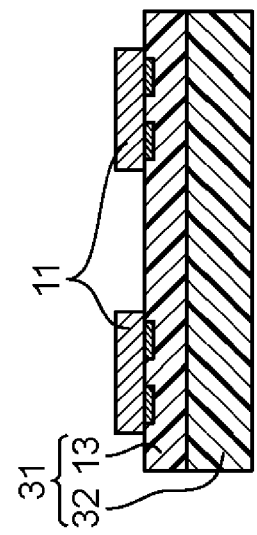
FIGS. 3A to 3F are schematic sectional views for explaining another example of the covering step in the manufacturing method for a semiconductor package according to the second embodiment of the present invention.

According to the examination by the inventors, in the manufacturing method for re-wiring on the insulating layer described in Patent Document 1 and Patent Document 2, the flip-chip mounting of the electrodes of the semiconductor element such as the semiconductor chip and the circuit of the substrate such as the printed wiring board via the solder bumps is not performed. Therefore, the problem that occurs in the case of the connection by the flip-chip mounting is considered to not occur.

However, since the step of forming an inter-layer via and the step of re-wiring are separately performed, alignment is necessary in each of the steps. Consequently, since shifts occur in the respective steps, a shift in a finally obtained semiconductor package is sometimes large because the shift is a combined shift of the shifts that occur in the respective steps. Therefore, even if the shift that occurs in the finally obtained semiconductor package is large, in order to secure electrical connection between the re-wired circuit and the semiconductor element and connection reliability, it is necessary to set a land portion connected to the via of the re-wired circuit, the electrodes of the semiconductor element, and the like relatively large taking into account an amount of the shift. For example, it is conceivable to set the land portion, the electrodes, and the like larger than the diameter of the inter-layer via. Therefore, there is a limit in narrowing pitches of the electrodes of the semiconductor elements and the re-wiring.

The present invention has been devised in view of such circumstances and has an object of providing a manufacturing method for a semiconductor package that can highly accurately perform the formation of a circuit on an insulating layer that covers a semiconductor element and the formation of vias for electrically connecting the circuit and electrodes of the semiconductor element, a semiconductor package obtained by the manufacturing method, and a semiconductor device including the semiconductor package.

Embodiments of the present invention are explained below. However, the present invention is not limited to the embodiments.

First, a first embodiment of the present invention is explained. More detailed embodiments of this embodiment are explained as second to fourth embodiments below.

A manufacturing method for a semiconductor package according to this embodiment includes a covering step of forming a covering insulating layer that covers the surface of a semiconductor element on which electrodes are formed, the semiconductor element including the electrodes on the principal plane thereof, a film-forming step of forming a resin film on the surface of the covering insulating layer on the electrodes side of the semiconductor element, a circuit pattern-forming step of forming a circuit pattern portion including recesses reaching the surfaces of the electrodes and a circuit groove having a desired shape and a desired depth, by applying laser processing or embossing to the covering insulating layer from an outer surface side of the resin film, a catalyst-depositing step of depositing a plating catalyst or a precursor thereof on the surface of the circuit pattern portion and the surface of the resin film, a film-separating step of separating the resin film from the covering insulating layer, and a plating processing step of forming a circuit electrically connected to the electrodes, by applying electroless plating to the covering insulating layer, from which the resin film is separated.

With such a manufacturing method, it is possible to highly accurately perform the formation of a circuit on the insulating layer (the covering insulating layer) that covers the semiconductor element and the formation of vias for electrically connecting the circuit and the electrodes of the semiconductor element.

A reason for the above is as explained below.

First, the manufacturing method for a semiconductor package according to this embodiment is a manufacturing method of forming, in the covering insulating layer (hereinafter also simply referred to as "insulating layer") that covers the semiconductor element, the circuit pattern portion including the recesses reaching the surfaces of the electrodes of the semiconductor element and the circuit groove and forming the circuit using the circuit pattern portion. Consequently, when the circuit is formed, the vias reaching the electrodes of the semiconductor element from the covering insulating layer (the insulating layer) are simultaneously formed. In other words, when the circuit pattern portion is formed on the insulating layer, positioning for applying the laser processing or the embossing only has to be performed once.

On the other hand, when the vias and the circuit are separately formed on the insulating layer that covers the semiconductor element, it is necessary to individually perform positioning for forming the vias and positioning for forming the circuit. Therefore, it is necessary to perform the positioning at least twice. Since a shift occurs in the positioning for forming the vias and the positioning for forming the circuit, a shift between the vias and the circuit in a finally obtained semiconductor package is sometimes large.

As explained above, with the manufacturing method for a semiconductor package according to this embodiment, it is possible to simultaneously perform the formation of the circuit on the insulating layer (the covering insulating layer) that covers the semiconductor element and the formation of the vias for electrically connecting the electrodes of the semiconductor element and the circuit and it is possible to suppress a shift caused by the positioning. Therefore, it is possible to highly accurately perform the formation of the circuit on the insulating layer (the covering insulating layer) that covers the semiconductor element and the formation of the vias for electrically connecting the electrodes of the semiconductor element and the circuit. In other words, it is possible to highly accurately form the circuit electrically connected to the electrodes of the semiconductor element.

Further, when the vias and the circuit are separately formed on the insulating layer that covers the semiconductor element, even if the shift explained above occurs large, usually, a portion of the circuit coupled to the vias is increased in size to form a land portion in order to secure electrical connection between the vias and the circuit.

On the other hand, in the case of the manufacturing method according to this embodiment, since the vias and the circuit are simultaneously formed, it is possible to suppress occurrence of the shift between the vias and the circuit and reduce the size of the land portion. Further, even if the land portion is not formed, satisfactory electrical connection between the vias and the circuit can be secured. Therefore, so-called landless may be adopted in which the land portion is not formed. Since the occurrence of the shift can be suppressed, even if the land portion is reduced in size, it is possible to suppress a decrease in connection reliability due to the deviation of the vias from the land portion.

In the case of the manufacturing method according to this embodiment, the recesses for forming the vias and the circuit groove are simultaneously formed by the laser processing or the embossing. Therefore, it is possible to suppress occurrence of a shift between the recesses for forming the vias and the circuit groove. Therefore, if alignment in the machining is performed with reference to the positions of semiconductor elements, even if a small shift occurs in the semiconductor element in the covering step, it is possible to highly accurately perform, on the electrodes of the semiconductor element, the formation of the circuit on the insulating layer (the covering insulating layer) that covers the semiconductor element and the formation of the vias for electrically connecting the electrodes of the semiconductor element and the circuit. In other words, it is possible to highly accurately form the circuit electrically connected to the electrodes of the semiconductor element.

In the manufacturing method according to this embodiment, desmear treatment may be applied after the electroless plating is applied. When fill-up plating is applied, the desmear treatment may be applied before or after the fill-up plating is applied. It is possible to remove unnecessary resin adhering to an electroless plating film by applying the desmear treatment. When a multilayer semiconductor device is assumed that includes the obtained semiconductor package and in which one or more wiring layers including circuits electrically connected to the circuit of the semiconductor package, it is possible to roughen a place where the circuit is not formed and increase adhesion to the wiring layers laminated in the semiconductor package. The desmear treatment is not specifically limited. Publicly-known desmear treatment can be used. Examples of the desmear treatment include immersion treatment in a permanganate solution or the like.

A second embodiment of the present invention is explained.

A manufacturing method for a semiconductor package according to this embodiment is not specifically limited as long as the manufacturing method is a method including the steps as explained above. Examples of the manufacturing method for a semiconductor package according to this embodiment include a manufacturing method in which the covering step is a step of embedding the semiconductor element in the covering insulating layer. Specifically, the manufacturing method for a semiconductor package according to the second embodiment of the present invention is a manufacturing method for a semiconductor package including a covering step of forming a covering insulating layer that covers to embed a semiconductor element including electrodes on the principal plane thereof, a film-forming step of forming a resin film on the surface of the covering insulating layer on the electrodes side of the semiconductor element, a circuit pattern-forming step of forming a circuit pattern portion including recesses reaching the surfaces of the electrodes and a circuit groove having a desired shape and a desired depth, by applying laser processing or embossing to the covering insulating layer from an outer surface side of the resin film, a catalyst-depositing step of depositing a plating catalyst or a precursor thereof on the surface of the circuit pattern portion and the surface of the resin film, a film-separating step of separating the resin film from the covering insulating layer, and a plating processing step of forming a circuit electrically connected to the electrodes, by applying electroless plating to the covering insulating layer, from which the resin film is separated. With such a manufacturing method, as explained above, it is possible to highly accurately perform the formation of a circuit on the insulating layer (the covering insulating layer) that covers the semiconductor element and the formation of vias for electrically connecting the circuit and the electrodes of the semiconductor element. Further, since the semiconductor element is embedded in the covering insulating layer, it is possible to further improve reliability concerning the semiconductor element.

The semiconductor element is embedded by the covering insulating layer, whereby a side surface of the surface of the semiconductor element on which the electrodes are formed is also covered with the covering resin layer. Consequently, it is possible to expand a region in which a circuit connected from the electrodes of the semiconductor element of a finally obtained semiconductor package via the vias, i.e., a re-wired circuit is formed. This means that, as explained below, the re-wired circuit can be formed further on the outer side than a region where the semiconductor element is arranged. It is possible to increase the number of output and input terminals of the semiconductor package using solder bumps formed on the re-wired circuit as explained above. Unlike the semiconductor package in the past in which the semiconductor element is connected to the multilayer circuit board by flip-chip mounting or wire bonding, in the manufacturing method according to this embodiment, the covering insulating layer that covers the semiconductor element plays a function of a substrate as well. Therefore, it is unnecessary to separately provide a substrate. In other words, a substrate-less semiconductor package is obtained. Therefore, it is possible to reduce the thickness of the obtained semiconductor package.

FIGS. 1A to 1G are schematic sectional views for explaining steps in the manufacturing method for a semiconductor package according to the second embodiment of the present invention.

First, a covering insulating layer that covers to embed semiconductor elements 11 including electrodes 11a on a principal plane is formed. The covering insulating layer is not specifically limited as long as the covering insulating layer is an insulating layer that covers to embed the semiconductor elements 11. Specifically, as shown in FIG. 1A, examples of the covering insulating layer include a covering insulating layer including a first insulating layer 12 and a second insulating layer 13. This step is equivalent to the covering step. The covering step is explained below.

Subsequently, as shown in FIG. 1B, a resin film 14 is formed on the surfaces of the semiconductor elements 11 on the electrodes 11a side. The surfaces of the semiconductor elements 11 on the electrodes 11a side is the surface of the second insulating layer 13 that covers the electrodes 11a of the semiconductor elements 11 among the surfaces of the covering insulating layer. This step is equivalent to the film-forming step.

Subsequently, as shown in FIG. 1C, laser processing or embossing is applied to the second insulating layer 13 of the covering insulating layer from the outer surface side of the resin film 14, whereby a circuit pattern portion 15 including recesses 15a reaching the surfaces of the electrodes 11a and a circuit groove 15b having a desired shape and a desired depth is formed. As a part of the circuit groove 15b, recesses for forming a through-hole or a land portion for securing electrical connection to other electronic components may be formed. A portion where an electroless plating film is formed by electroless plating, i.e., a portion where an electric circuit is formed is defined by the circuit pattern portion 15. The laser processing or the embossing for forming the recesses 15a is boring machining for exposing the electrodes 11a. The laser processing or the embossing for forming the circuit groove 15b is machining for cutting the circuit groove 15b exceeding the thickness of the resin film 14 with reference to the outer surface of the resin film 14. This step is equivalent to the circuit pattern-forming step.

Subsequently, as shown in FIG. 1D, a plating catalyst or a precursor 16 thereof is deposited on the surface of the circuit pattern portion 15 and the surface of the resin film 14 on which the circuit pattern portion 15 is not formed. This step is equivalent to the catalyst-depositing step.

Subsequently, as shown in FIG. 1E, the resin film 14 remaining after the circuit pattern portion 15 is formed is separated (peeled) from the covering insulating layer, specifically, the surface of the second insulating layer 13 that covers the electrodes 11a of the semiconductor element 11. Consequently, the plating catalyst or the precursor 16 thereof can be left only in the circuit patter section 15 of the second insulating layer 13. In other words, the plating catalyst or a precursor 16a thereof corresponding to the positions of the recesses 15a can be left in the recesses 15a. The plating catalyst or a precursor 16b corresponding to the position of the circuit groove 15b can be left in the circuit groove 15b. On the other hand, the plating catalyst or the precursor thereof deposited on the surface of the resin film 14 is removed together with the resin film 14 in a state in which the plating catalyst or the precursor is born on the resin film 14. This step is equivalent to the film-separating step.

Subsequently, electroless plating is applied to the second insulating layer 13 from which the resin film 14 is separated. Consequently, an electroless plating film is formed only in a portion where the plating catalyst or the precursor 16 thereof remains. In other words, as shown in FIG. 1F, electroless plating films 17a corresponding to the positions of the recesses 15a and an electroless plating film 17b corresponding to the position of the circuit groove 15b are formed. This step is equivalent to the plating processing step.

The electroless plating film 17b corresponding to the position of the circuit groove 15b formed by the electroless plating may be directly formed as an electric circuit. The electroless plating film 17b does not have to be directly formed as an electric circuit. In that case, electroless plating (fill-up plating) may be further applied to the electroless plating film 17b to form an electric circuit.

The thickness of the electroless plating film 17b is not specifically limited. Specifically, as shown in FIG. 1F, the surface of the electroless plating film 17b may be formed to be higher than the surface of the second insulating layer 13 or may be formed to be the same as or lower than the surface of the second insulating layer 13.

The electroless plating films 17a formed by the electroless plating and corresponding to the positions of the recesses 15a may be formed as vias for securing electrical connection between the electroless plating film 17b and the electrodes 11a of the semiconductor element 11 or do not have to be directly formed as vias. When the electroless plating films 17a cannot be directly formed as vias, electroless plating (fill-up plating) only has to be applied to the electroless plating films 17a to be formed as vias.

With such a manufacturing method, it is possible to highly accurately perform the formation of the circuit 17b on the second insulating layer 13 (the covering insulating layer) that covers the semiconductor element 11 and the formation of the vias for electrically connecting the circuit 17b and the electrodes 11a of the semiconductor element 11.

The manufacturing method for a semiconductor package according to this embodiment may be a manufacturing method for forming one layer of a re-wired circuit or may be a manufacturing method for forming two or more layers as shown in FIGS. 1A to 1G. Specifically, as shown in FIG. 1F, after the electric circuit is formed, the steps may be applied again to form two or more layers of re-wired circuits.

Finally, after the vias 17a and the circuit 17b are formed, as shown in FIG. 1G, an insulating layer 18 may be separately formed on the second insulating layer 13 to cover the vias 17a and the circuit 17b. Recesses reaching the circuit 17b may be formed in the insulating layer 18. Other electronic components or bumps 19 for securing electrical connection between the circuit of the semiconductor package and circuits of other wiring layers may be formed in the recesses. When there are two or more semiconductor elements 11, the semiconductor elements adjacent to each other may be cut to form semiconductor packages. As shown in FIG. 1G, one semiconductor element 11 may be formed in each of the semiconductor packages obtained by cutting the semiconductor elements as explained above. However, the number of semiconductor elements 11 is not limited to this. For example, each of the semiconductor packages may include two or more semiconductor elements. When the semiconductor package includes the two or more semiconductor elements, the semiconductor elements may be semiconductor elements having the same kind of function or may be semiconductor elements having different kinds of functions.

A wiring layer having a circuit electrically connected to the circuit of the semiconductor package is formed on the semiconductor package, whereby a semiconductor device of a so-called multilayer structure is obtained. In other words, a semiconductor device including the semiconductor package and including one or more wiring layers including circuits electrically connected to the circuit of the semiconductor package is obtained.

As shown in FIG. 1F, the circuit 17b is desirably formed, with respect to the surface of the covering insulating layer, on the outer side of the outer edge of the shape of the semiconductor element 11 projected in a direction orthogonal to the principal plane of the semiconductor element 11. In other words, the circuit 17b is desirably formed wide exceeding the width of the semiconductor element 11. Consequently, electrical connection to the other electronic components is easily secured. When a semiconductor device of the multilayer structure is manufactured, electrical connection to circuits of wiring layers is easily secured. Further, in an obtained semiconductor package, it is possible to increase the number of output and input terminals.

The covering step is explained.

The covering step is not specifically limited as long as the covering step is a step that can form a covering insulating layer that covers to embed the semiconductor element 11. Specifically, examples of the covering step include a step explained below.

An example of the covering step in the manufacturing method for a semiconductor package according to this embodiment is explained.

Specifically, examples of the covering step include a step including a bonding step of bonding at least one or more of the semiconductor elements in a predetermined position of a supporting body to which the semiconductor elements are detachably attached, a sealing resin-covering step of covering the semiconductor elements bonded to the supporting body with sealing resin such that the semiconductor elements are embedded, a hardening step of hardening the sealing resin and forming a first insulating layer, a supporting body-separating step of separating the supporting body from the semiconductor elements and the first insulating layer, and a second insulating layer-forming step of forming a second insulating layer on the surfaces of the semiconductor elements and the first insulating layer with which the supporting body is in contact to thereby form the covering insulating layer including the first insulating layer and the second insulating layer.

FIGS. 2A to 2G are schematic sectional views for explaining an example of the covering step in the manufacturing method for a semiconductor package according to the second embodiment of the present invention.

First, as shown in FIGS. 2A to 2C, at least one or more semiconductor elements 11 are bonded in predetermined positions in a supporting body 21 to which a semiconductor element is detachably attached. This step is equivalent to the bonding step.

The supporting body 21 is not specifically limited as long as the supporting body 21 is a supporting body to which the semiconductor element is detachably attached, for example, to which the semiconductor element can be fixed and from which the semiconductor element can be separated. Specifically, examples of the supporting body 21 include the supporting body 21 shown in FIG. 2A. The supporting body 21 includes a base material 22 and a layer 23 that is provided at least on one surface of the base material 22 and to which the semiconductor element is detachably attached. The bonding step is desirably a step of bonding the semiconductor element 11 to the layer 23 of the supporting body 21 to which the semiconductor element is detachably attached. The surface of the semiconductor element 11 on which the electrodes 11a are present is desirably bonded. Examples of the layer 23 to which the semiconductor element is detachably attached include a layer having adhesion and tackiness to the semiconductor element. More specifically, examples of the layer 23 include an adhesive layer made of silicone resin, an adhesive layer made of a rubber adhesive, an adhesive layer made of an acrylic adhesive, and an adhesive layer made of a urethane adhesive. The layer 23 to which the semiconductor element is detachably attached may be a layer that is bonded to the semiconductor element and can be directly separated (peeled) after being bonded to the semiconductor element or may be a layer that can be bonded to the semiconductor element and can be separated by heating or ultraviolet ray irradiation after being bonded to the semiconductor element. Among the adhesive layers, the adhesive layer made of the silicone resin is desirable in terms of heat resistance, easiness of attachment and detachment (re-peelability) of the semiconductor element, and chemical resistance. The base material 22 is not specifically limited as long as the base material 22 is a base material that can hold the layer 23 to which the semiconductor element 11 is detachably attached and can maintain the shape thereof in the covering step. Specifically, examples of the base material 22 include a glass substrate, a ceramics substrate, an organic substrate, and a metal plate such as a stainless steel (SUS) plate.

Subsequently, as shown in FIGS. 2D and 2E, the semiconductor element 11 bonded to the supporting body 21 is covered with the sealing resin 25 to be embedded. This step is equivalent to the sealing resin-covering step.

The sealing resin-covering step may be a step of coating sealing resin. However, as shown in FIGS. 2D and 2E, for example, a step of covering the semiconductor element 11 with a resin sheet or resin film 24 including sealing resin 25 and a base material 26 that supports the sealing resin 25, and pressing the resin sheet or resin film 24 such that the semiconductor element 11 bonded to the supporting body 21 is covered with the sealing resin 25 so as to be embedded is desirably used. When such a resin sheet or resin film 24 is used, since a wide area can be easily covered, it is possible to increase the number of semiconductor elements that can be covered. In other words, it is possible to increase the number of semiconductor packages that can be simultaneously manufactured. The usage of the resin sheet or resin film 24 is also desirable in that, for example, in manufacturing in a large size, a first insulating layer to be formed secures thickness accuracy in a work surface. The sealing resin is not specifically limited, i.e., not limited to such a resin sheet or resin film. For example, a powder sealing material or a liquid sealing material can be used. The powder sealing material or the liquid sealing material can be used as sealing resin when the sealing resin-covering step is performed by transfer molding or press molding.

The sealing resin 25 is not specifically limited as long as the sealing resin 25 is sealing resin from which an insulating layer can be formed by hardening or the like after covering to embed the semiconductor element 11 bonded to the supporting body 21. Specifically, examples of the sealing resin 25 include sealing resin from which the first insulating layer 12 shown in FIG. 2F can be formed by hardening or the like. The sealing resin 25 is desirably a resin sheet or a resin film including hardening resin. Such sealing resin can easily cover a wide area as explained above. Therefore, it is possible to increase the number of semiconductor elements that can be covered with the sealing resin. The sealing resin 25 desirably includes not only the sealing resin but also a filler. The filler is not specifically limited as long as the filler is a filler contained in the sealing resin. Examples of the filler include an inorganic filler such as inorganic particulates and organic particulates. The inorganic filler is desirable as the filler. In other words, the sealing resin 25 is more desirably a resin sheet or a resin film including the hardening resin and the inorganic filler. With such sealing resin, it is possible to suppress occurrence of a warp between an obtained insulating layer and other insulating layers, semiconductor elements, and the like. This is considered to be because it is possible to approximate, with the contained inorganic filler, a coefficient of thermal expansion thereof with the coefficients of thermal expansion of the other insulating layers, semiconductor elements, and the like. Consequently, it is desirable to use, as the sealing resin 25, the resin sheet or the resin film including the hardening resin and the inorganic filler in terms of heat resistance, a low warp of a molded product, and a reduction in thermal linear expansion. Examples of the hardening resin included in the sealing resin 25 include thermosetting resin such as epoxy resin, acrylic resin, polycarbonate resin, polyimide resin, polyphenylene sulfide resin, polyphenylene ether resin, cyanate resin, benzoxazine resin, and bismaleimide resin. The inorganic filler included in the sealing resin 25 is not specifically limited as long as the inorganic filler is an inorganic filler, the coefficient of thermal expansion of which can be adjusted to match the coefficients of thermal expansion of the other insulating layers, semiconductor elements, and the like. Examples of the inorganic filler include inorganic particulates such as silica particulates. The organic particulates included in the sealing resin 25 are not specifically limited as long as the organic particulates are organic particulates that can relax stress generated during heating because of a difference between a coefficient of thermal expansion thereof and the coefficients of thermal expansion of the other insulating layers, semiconductor elements, and the like. Examples of the organic particulates include rubber particles. The base material 26 is not specifically limited as long as the base material 26 is a base material, the shape of which can be maintained by pressing of the resin sheet or resin film 24. Specifically, examples of the base material 26 include an organic substrate such as a PET substrate, a glass substrate, and a metal plate such as a SUS plate.

Subsequently, as shown in FIG. 2F, the sealing resin 25 is hardened to form the first insulating layer 12. A condition for hardening the sealing resin 25 is not specifically limited. If the hardening resin included in the sealing resin 25 is thermosetting resin, the condition only has to be a heating condition under which the resin can be hardened. This step is equivalent to the hardening step.

Subsequently, as shown in FIG. 2F, the supporting body 21 can be separated (peeled) from the semiconductor element 11 and the first insulating layer 12. This step is equivalent to the supporting body-separating step. In the separating, before or after the supporting body 21 is separated, as shown in FIG. 2F, the base material 26 of the resin sheet or resin film 24 may also be separated or does not have to be separated. When the base material 26 is separated, the base material 26 may be separated in the same period as the separating of the supporting body 21, i.e., in the supporting body-separating step or may be separated after the supporting body-separating step. For example, the base material 26 may be separated after the second insulating layer explained below is formed, i.e., after the second insulating layer-forming step.

Finally, as shown in FIG. 2G, the second insulating layer 13 is formed on the surfaces of the semiconductor element 11 and the first insulating layer 12 with which the supporting body 21 is in contact. Consequently, a covering insulating layer including the first insulating layer 12 and the second insulating layer 13 is formed. This step is equivalent to the second insulating layer-forming step.

The formation of the second insulating layer 13 is not specifically limited as long as an insulating layer can be formed on the surfaces of the semiconductor element 11 and the first insulating layer 12. Examples of the second insulating layer 13 include a resin layer. Specifically, examples of resin forming the resin layer include epoxy resin, acrylic resin, polycarbonate resin, polyimide resin, polyphenylene sulfide resin, polyphenylene ether resin, cyanate resin, benzoxazine resin, bismaleimide resin, phenol resin, and benzocyclobutene resin. The second insulating layer 13 desirably includes not only the resin but also a filler. Consequently, it is possible to suppress occurrence of a warp between an obtained insulating layer and other insulating layers, semiconductor elements, and the like. This is considered to be because it is possible to approximate, with the contained filler, a coefficient of thermal expansion thereof with the coefficients of thermal expansion of the other insulating layers, semiconductor elements, and the like. The filler is not specifically limited. Examples of the filler include an inorganic filler such as inorganic particulates and organic particulates. The inorganic filler is desirable as the filler. The inorganic filler included in the second insulating layer 13 is not specifically limited as long as the inorganic filler is an inorganic filler, the coefficient of thermal expansion of which can be adjusted to match the coefficients of thermal expansion of the other insulating layers, semiconductor elements, and the like. Examples of the inorganic filler include inorganic particulates such as silica particulates. The organic particulates included in the second insulating layer 13 are not specifically limited as long as the organic particulates are organic particulates that can relax stress generated during heating because of a difference between a coefficient of thermal expansion thereof and the coefficients of thermal expansion of the other insulating layers, semiconductor elements, and the like. Examples of the organic particulates include rubber particles. The formation of the second insulating layer 13 can be performed by a method same as the method of forming the first insulating layer 12. Specifically, examples of the method include a method of forming the second insulating layer 13 using a resin sheet or a resin film and a method of forming the second insulating layer 13 by applying a liquid sealing material by coating. Among the methods, it is desirable to use the resin sheet or the resin film for the formation of the second insulating layer 13 because of a reason same as a reason for the formation of the first insulating layer 12. It is more desirable to use a resin sheet or a resin film including the hardening resin and the inorganic filler.

It is possible to easily perform the covering step by applying such a covering step as the covering step. Therefore, it is possible to easily perform the manufacturing method for a semiconductor package according to this embodiment.

The covering step including the hardening step of forming the insulating layer is performed in a state in which the semiconductor element is temporarily provisionally fixed to the supporting body. Therefore, it is possible to suppress occurrence of a shift of the semiconductor element. The covering step including the hardening step of forming the insulating layer is performed in a state in which the semiconductor element is temporarily provisionally fixed to the supporting body. Therefore, it is possible to suppress, with the presence of the supporting body, a warp from occurring in a structure in which the semiconductor element is covered with the covering insulating layer.

Another example of the covering step is explained.

As explained above, the covering step is not specifically limited as long as the covering step is a step that can form a covering insulating layer that covers to embed the semiconductor element 11. However, examples of the covering step include a step explained below.

Specifically, examples of the covering step include a step including a bonding step of bonding at least one or more of the semiconductor elements in a predetermined position of a third insulating layer of a supporting body including a base material and the third insulating layer which is provided on at least one surface of the base material and to which the semiconductor elements can be fixed, a sealing resin-covering step of covering the semiconductor elements bonded to the supporting body with sealing resin such that the semiconductor elements are embedded, a hardening step of hardening the sealing resin and forming a fourth insulating layer to thereby form the covering insulating layer including the third insulating layer and the fourth insulating layer, and a base material-separating step of separating the base material from the third insulating layer.

FIGS. 3A to 3F are schematic sectional views for explaining another example of the covering step in the manufacturing method for a semiconductor package according to the second embodiment of the present invention.

Figure 3B:
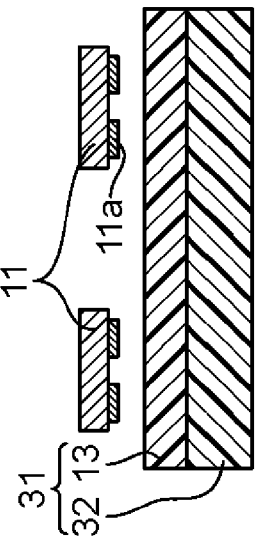
Figure 3C:
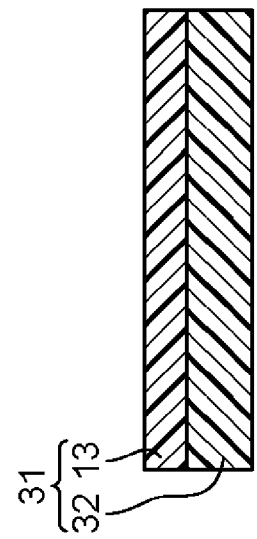

First, as shown in FIGS. 3A to 3C, at least one or more semiconductor elements 11 are bonded in predetermined positions in a supporting body 31 to which a semiconductor element is detachably attached. This step is equivalent to the bonding step.

The supporting body 31 includes, as shown in FIG. 3A, a base material 32 and a third insulating layer 13 that is provided on at least one surface of the base material 32 and to which the semiconductor element can be fixed. In FIGS. 1A to 1G, the third insulating layer 13 is the second insulating layer 13. The bonding step is desirably a step of bonding the semiconductor element 11 to the third insulating layer 13 of the supporting body 31. The surface of the semiconductor element 11 on which the electrodes 11a are present is desirably bonded. The third insulating layer 13 is not specifically limited as long as the third insulating layer 13 is a layer to which the semiconductor elements can be fixed. Specifically, examples of resin forming the third insulating layer 13 include epoxy resin, acrylic resin, polycarbonate resin, polyimide resin, polyphenylene sulfide resin, polyphenylene ether resin, cyanate resin, benzoxazine resin, and bismaleimide resin, phenol resin, and benzocyclobutene resin.

The base material 32 is not specifically limited as long as the base material 32 is a base material that can hold the third insulating layer 13 and can maintain the shape thereof in the covering step and from which the third insulating layer 13 can be separated (peeled) in the base material-separating step explained below. Specifically, examples of the base material 32 include a metal plate such as a stainless steel (SUS) plate, a glass substrate, a ceramic substrate, an organic substrate, and an organic film. The base material 32 may be a base material that holds the third insulating layer 13 and includes, according to necessity, an adhesive layer on the surface in order to separate the third insulating layer 13. Specifically, examples of the base material 32 include a SUS plate or the like, on the surface of which an adhesive layer such as an adhesive layer made of silicone resin, an adhesive layer made of a rubber adhesive, an adhesive layer made of an acrylic adhesive, or an adhesive layer made of an urethane adhesive is formed. The base material 32 may be a base material subjected to release treatment on the surface or a base material coated with a release agent or coated with polytetrafluoroethylene on the surface in order to facilitate separating of the third insulating layer 13. Specifically, examples of the release agent include a silicone release agent and a fluorine release agent.

Figure 3F:
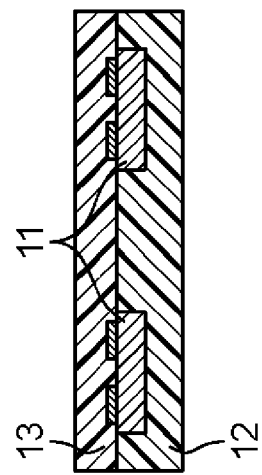
Figure 3E:
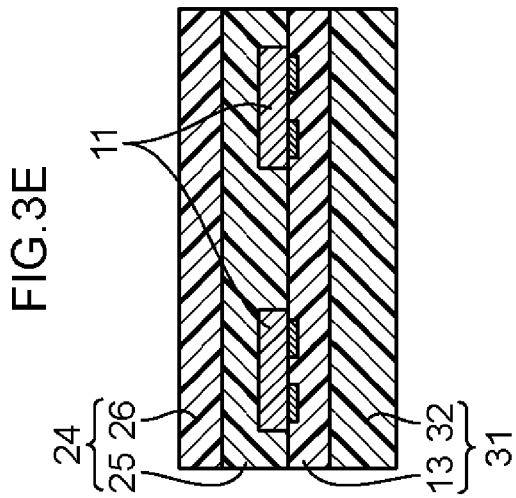
Figure 3D:
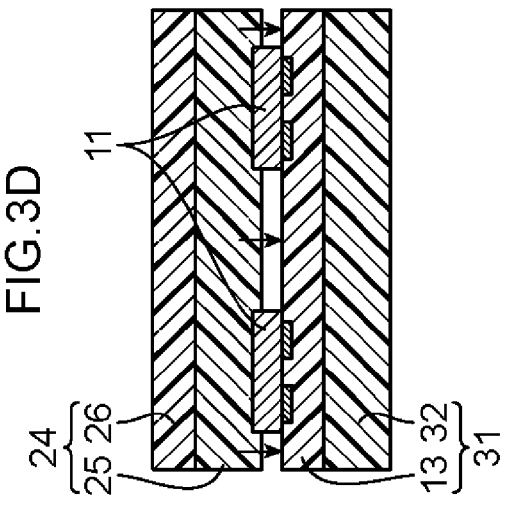

Subsequently, as shown in FIGS. 3D and 3E, the semiconductor element 11 bonded to the supporting body 31 is covered with the sealing resin 25 to be embedded. This step is equivalent to the sealing resin-covering step and is the same as the sealing resin-covering step in FIGS. 2D and 2E.

Subsequently, as shown in FIG. 3F, the sealing resin 25 is hardened to form the fourth insulating layer 12. Consequently, a covering insulating layer including the fourth insulating layer 12 and the third insulating layer 13 is formed. The fourth insulating layer 12 is the first insulating layer 12 in FIGS. 1A to 1G. This step is equivalent to the hardening step and is the same as the hardening step in FIG. 2F.

Finally, as shown in FIG. 3F, the base material 32 of the support body 31 is separated (peeled) from the third insulating layer 13. This step is equivalent to the base material-separating step. In the separating, before or after the base material 32 is separated, as shown in FIG. 3F, the base material 26 of the resin sheet or resin film 24 may also be separated or does not have to be separated.

It is possible to easily perform the covering step by applying such a covering step as the covering step. Therefore, it is possible to easily perform the manufacturing method for a semiconductor package according to this embodiment.

In a state in which the semiconductor element is fixed to one insulating layer forming the covering insulating layer, specifically, to the third insulating layer 13, the fourth insulating layer 12, which is the other insulating layer, is formed to form the covering insulating layer. Therefore, it is possible to suppress occurrence of a shift of the semiconductor element. The covering step is performed in a state in which the semiconductor element is fixed to the third insulating layer 13. Therefore, it is possible to suppress, with the presence of the third insulating layer 13, a warp from occurring in a structure in which the semiconductor element is covered with the covering insulating layer.

A third embodiment of the present invention is explained.

Examples of a manufacturing method for a semiconductor package according to this embodiment include a manufacturing method in which the covering step is a step of forming, as the covering insulating layer, a covering insulating layer such that the surface of the semiconductor element on the opposite side to the surface (a circuit surface) on which electrodes are formed is exposed. Specifically, the manufacturing method for a semiconductor package according to the third embodiment of the present invention includes a covering step of forming a covering insulating layer that covers the surface of a semiconductor element on which electrodes are formed, the semiconductor element including the electrodes on the principal plane thereof, a film-forming step of forming a resin film on the surface of the covering insulating layer, a circuit pattern-forming step of forming a circuit pattern portion including recesses reaching the surfaces of the electrodes and a circuit groove having a desired shape and a desired depth, by applying laser processing or embossing to the covering insulating layer from an outer surface side of the resin film, a catalyst-depositing step of depositing a plating catalyst or a precursor thereof on the surface of the circuit pattern portion and the surface of the resin film, a film-separating step of separating the resin film from the covering insulating layer, and a plating processing step of forming a circuit electrically connected to the electrodes, applying electroless plating to the covering insulating layer, from which the resin film is separated. With such a manufacturing method, as explained above, it is possible to highly accurately perform the formation of a circuit on the insulating layer (the covering insulating layer) that covers the semiconductor element and the formation of vias for electrically connecting the circuit and the electrodes of the semiconductor element. Further, the covering insulating layer is formed such that the surface of the semiconductor element on the opposite side to the electrodes is exposed. Therefore, it is possible to increase heat radiation properties of the semiconductor layer and reduce the thickness of the covering insulating layer.

The semiconductor element is embedded with the covering insulating layer, whereby a side surface of the surface of the semiconductor element on which the electrodes are formed is also covered with the covering resin layer. Consequently, it is possible to expand a region in which a circuit connected from the electrodes of the semiconductor element of a finally obtained semiconductor package via the vias, i.e., a re-wired circuit is formed. This means that, as explained below, the re-wired circuit can be formed further on the outer side than a region where the semiconductor element is arranged. It is possible to increase the number of output and input terminals of the semiconductor package using solder bumps formed on the re-wired circuit formed as explained above. Unlike the semiconductor package in the past in which the semiconductor element is connected to the multilayer circuit board by flip-chip mounting or wire bonding, in the manufacturing method according to this embodiment, the covering insulating layer that covers the semiconductor element plays a function of a substrate as well. Therefore, it is unnecessary to separately provide a substrate. In other words, a substrate-less semiconductor package is obtained. Therefore, it is possible to reduce the thickness of the obtained semiconductor package.

FIGS. 4A to 4I are schematic sectional views for explaining steps in the manufacturing method for a semiconductor package according to the embodiment of the present invention.

Figure 4A:
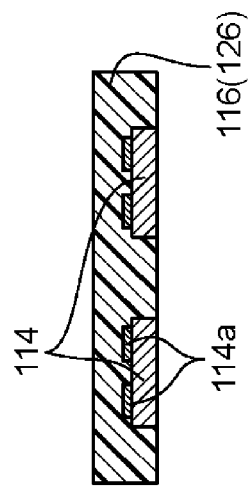
FIGS. 4A to 4I are schematic sectional views for explaining steps in a manufacturing method for a semiconductor package according to a third embodiment of the present invention.
Figure 4B:
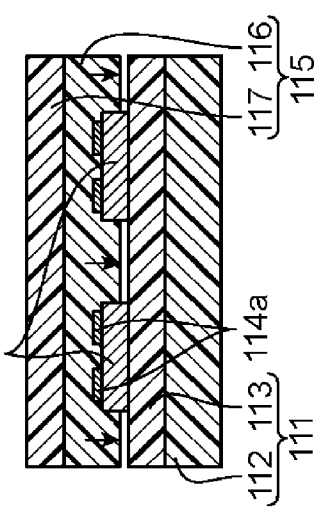
Figure 4C:
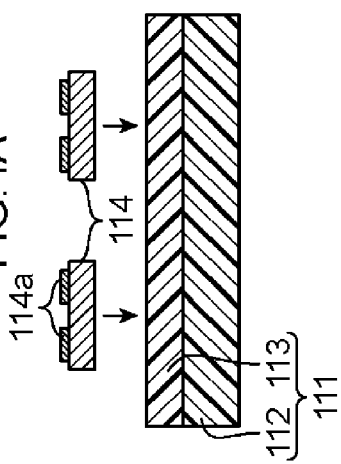

First, as shown in FIGS. 4A to 4C, a covering insulating layer 126 that covers a surface (a circuit surface) on which electrodes 114a are formed of a semiconductor element 114 including the electrodes 114a on a principal plane is formed. This step is equivalent to the covering step. The covering step is explained below.

Figure 4D:
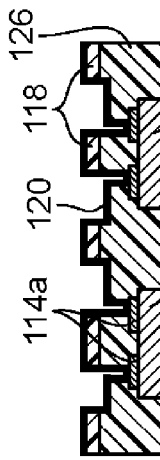

Subsequently, as shown in FIG. 4D, a resin film 118 is formed on the surface of the covering insulating layer 126. This step is equivalent to the film-forming step.

Figure 4E:
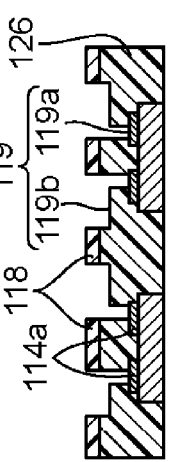

Subsequently, as shown in FIG. 4E, laser processing or embossing is applied to the covering insulating layer 126 from the outer surface side of the resin film 118, whereby a circuit pattern portion 119 including recesses 119a reaching the surfaces of the electrodes 114a and a circuit groove 119b having a desired shape and a desired depth is formed. As a part of the circuit groove 119b, recesses for forming a through-hole or a land portion for securing electrical connection to other electronic components may be formed. A portion where an electroless plating film is formed by electroless plating, i.e., a portion where an electric circuit is formed is defined by the circuit pattern portion 119. The laser processing or the embossing for forming the recesses 119a is boring machining for exposing the electrodes 114a. The laser processing or the embossing for forming the circuit groove 119b is machining for cutting the circuit groove 119b exceeding the thickness of the resin film 118 with reference to the outer surface of the resin film 118. This step is equivalent to the circuit pattern-forming step.

Figure 4F:
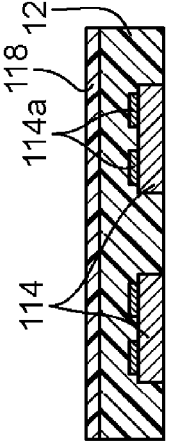

Subsequently, as shown in FIG. 4F, a plating catalyst or a precursor 120 thereof is deposited on the surface of the circuit pattern portion 119 and the surface of the resin film 118 on which the circuit pattern portion 119 is not formed. This step is equivalent to the catalyst-depositing step.

Figure 4G:
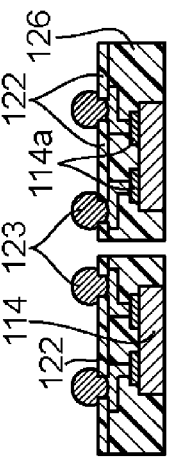

Subsequently, as shown in FIG. 4G, the resin film 118 remaining after the circuit pattern portion 119 is formed is separated (peeled) from the surface of the covering insulating layer 126. Consequently, the plating catalyst or the precursor 120 thereof can be left only in the circuit patter section 119 of the covering insulating layer 126. In other words, the plating catalyst or a precursor 120a thereof corresponding to the positions of the recesses 119a can be left in the recesses 119a. The plating catalyst or a precursor 120b corresponding to the position of the circuit groove 119b can be left in the circuit groove 119b. On the other hand, the plating catalyst or the precursor thereof deposited on the surface of the resin film 118 is removed together with the resin film 118 in a state in which the plating catalyst or the precursor is born on the resin film 118. This step is equivalent to the film-separating step.

Figure 4H:
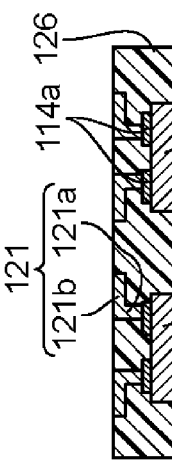

Subsequently, electroless plating is applied to the covering insulating layer 126 from which the resin film 118 is separated. Consequently, an electroless plating film is formed only in a portion where the plating catalyst or the precursor 120 thereof remains. In other words, as shown in FIG. 4H, electroless plating films 120a corresponding to the positions of the recesses 119a and an electroless plating film 120b corresponding to the position of the circuit groove 119b are formed. This step is equivalent to the plating processing step.

An electroless plating film 121b corresponding to the position of the circuit groove 119b formed by the electroless plating may be directly formed as an electric circuit. The electroless plating film 121b does not have to be directly formed as an electric circuit. In that case, electroless plating (fill-up plating) may be further applied to the electroless plating film 121b to form an electric circuit.

The thickness of the electroless plating film 121b is not specifically limited. Specifically, as shown in FIG. 4H, the surface of the electroless plating film 121b may be formed to be flush with the surface of the covering insulating layer 126, or may be formed to be higher than the surface of the covering insulating layer 126, or may be formed to be lower than the surface of the covering insulating layer 126.

The electroless plating films 120a formed by the electroless plating and corresponding to the positions of the recesses 119a may be formed as vias for securing electrical connection between the electroless plating film 120b and the electrodes 114a of the semiconductor element 114 or do not have to be directly formed as vias. When the electroless plating films 120a cannot be directly formed as vias, electroless plating (fill-up plating) only has to be applied to the electroless plating films 120a to be formed as vias.

With such a manufacturing method, it is possible to highly accurately perform the formation of the circuit on the insulating layer (the covering insulating layer) 126 that covers the semiconductor element 114 and the formation of the vias for electrically connecting the circuit and the electrodes 114a of the semiconductor element 114.

The manufacturing method for a semiconductor package according to this embodiment may be a manufacturing method for forming one layer of a re-wired circuit or may be a manufacturing method for forming two or more layers as shown in FIGS. 4A to 4I. Specifically, as shown in FIG. 4H, after the electric circuit is formed, the steps may be applied again to form two or more layers of re-wired circuits.

Figure 4I:

Finally, after vias 121a and a circuit 121b are formed, as shown in FIG. 4I, an insulating layer 122 may be separately formed on the covering insulating layer 126 to cover the vias 121a and the circuit 121b. Recesses reaching the circuit 121b may be formed in the insulating layer 122. Other electronic components or bumps 123 for securing electrical connection between the circuit of the semiconductor package and circuits of other wiring layers may be formed in the recesses. When there are two or more semiconductor elements 114, the semiconductor elements adjacent to each other may be cut to form semiconductor packages. As shown in FIG. 4I, one semiconductor element 114 may be formed in each of the semiconductor packages obtained by cutting the semiconductor elements as explained above. However, the number of semiconductor elements 114 is not limited to this. For example, each of the semiconductor packages may include two or more semiconductor elements. When the semiconductor package includes the two or more semiconductor elements, the semiconductor elements may be semiconductor elements having the same kind of function or may be semiconductor elements having different kinds of functions.

A wiring layer having a circuit electrically connected to the circuit of the semiconductor package is formed on the semiconductor package, whereby a semiconductor device of a so-called multilayer structure is obtained. In other words, a semiconductor device including the semiconductor package and including one or more wiring layers including circuits electrically connected to the circuit of the semiconductor package is obtained.

As shown in FIG. 4I, the circuit 121b is desirably formed, with respect to the surface of the covering insulating layer, on the outer side of the outer edge of the shape of the semiconductor element 114 projected in a direction orthogonal to the principal plane of the semiconductor element 114. In other words, the circuit 121b is desirably formed wide exceeding the width of the semiconductor element 114. Consequently, electrical connection to the other electronic components is easily secured. When a semiconductor device of the multilayer structure is manufactured, electrical connection to circuits of wiring layers is easily secured.

The covering step is explained.

The covering step is not specifically limited as long as the covering step is a step that can form the covering insulating layer 126 that covers to the surface of the semiconductor element 114 on which the electrodes 114a are formed. Specifically, examples of the covering step include a step explained below.

An example of the covering step in the manufacturing method for a semiconductor package according to this embodiment is explained.

Specifically, examples of the covering step include a step including a sticking step of sticking at least one or more of the semiconductor elements to a supporting body such that the surfaces of the semiconductor elements on the opposite side to the electrodes come into contact with predetermined positions of the supporting body, a sealing resin-covering step of covering, with sealing resin, the surfaces on which the electrodes are formed of the semiconductor elements stuck to the supporting body, and a hardening step of hardening the sealing resin and forming the covering insulating layer.

First, as shown in FIG. 4A, at least one or more semiconductor elements 114 are stuck to a supporting body 111 such that the surfaces of the semiconductor elements 114 on the opposite side to the electrodes 114a come into contact with predetermined positions of the supporting body 111. This step is equivalent to the sticking step. The supporting body 111 is not specifically limited as long as the supporting body 111 is a supporting body to which a semiconductor element can be stuck.

The supporting body 111 is desirably a detachably attached supporting body to which the semiconductor element can be not only stuck but also fixed and from which the semiconductor element can be separated (peeled). With such a supporting body 111 detachably attached to the semiconductor element, the supporting body 111 is separated, for example, after the covering step, more specifically, after the hardening step of the covering step, whereby a semiconductor package is obtained in which the surface of the semiconductor element 114 on the opposite side to the electrodes 114a is exposed. Consequently, it is possible to obtain a semiconductor package excellent in heat radiation properties. A period when the supporting body 111 is separated is not specifically limited as long as the period is after the covering step. Specifically, the period may be after the film-separating step, may be immediately before the plating processing step is performed, or may be after the plating processing is performed. The period is desirably after the covering step from the viewpoint of reducing the influence of heat generated in the steps and protecting the semiconductor element and the like.

Specifically, examples of the supporting body 111 include the supporting body 111 shown in FIG. 4A. The supporting body 111 includes a base material 112 and a layer 113 that is provided on at least one surface of the base material 112 and to which the semiconductor element is detachably attached. Examples of the layer 113 to which the semiconductor element is detachably attached include a layer having adhesion and tackiness to the semiconductor element. More specifically, examples of the layer 113 include an adhesive layer made of silicone resin, an adhesive layer made of a rubber adhesive, an adhesive layer made of an acrylic adhesive, and an adhesive layer made of a urethane adhesive. Among the adhesive layers, the adhesive layer made of the silicone resin is desirable in terms of heat resistance, easiness of attachment and detachment (re-peelability) of the semiconductor element, and chemical resistance. The base material 112 is not specifically limited as long as the base material 112 is a base material that can hold the layer 113 to which the semiconductor element is detachably attached and can maintain the shape thereof in the covering step. Specifically, examples of the base material 112 include a glass substrate, a ceramics substrate, an organic substrate, and a metal plate such as a stainless steel (SUS) plate.

Subsequently, as shown in FIGS. 4B and 4C, the semiconductor element 114 stuck to the supporting body 111 is covered with the sealing resin 116 such that the surface of the semiconductor element 114 on which the electrodes 114a are formed is covered. This step is equivalent to the sealing resin-covering step.

The sealing resin-covering step may be a step of coating sealing resin. However, as shown in FIG. 4B, for example, a step of covering the semiconductor element 114 with a resin sheet or resin film 115 including sealing resin 116 and a base material 117 that supports the sealing resin 116, and pressing the s resin sheet or resin film 115 to thereby cover the surface, of the semiconductor element 114 stuck to the supporting body 111, on which the electrodes 114a are formed with the sealing resin 116 is desirably used. When such a resin sheet or resin film 115 is used, since a wide area can be easily covered, it is possible to increase the number of semiconductor elements that can be covered. In other words, it is possible to increase the number of semiconductor packages that can be simultaneously manufactured. The usage of the resin sheet or resin film 115 is also desirable in that, for example, in manufacturing in a large size, a first insulating layer to be formed secures thickness accuracy in a work surface. The sealing resin is not specifically limited, i.e., not limited to such a resin sheet or resin film. For example, a powder sealing material or a liquid sealing material can be used. The powder sealing material or the liquid sealing material can be used as sealing resin when the sealing resin-covering step is performed in the step of coating the sealing resin.

The sealing resin 116 is not specifically limited as long as the sealing resin 116 is sealing resin from which the covering insulating layer 126 can be formed by hardening or the like after covering the surface on which the electrodes 114a are formed of the semiconductor element 114 stuck to the supporting body 111. Specifically, examples of the sealing resin 116 include sealing resin from which the covering insulating layer 126 shown in FIG. 4C can be formed by hardening or the like. The sealing resin 116 is desirably a resin sheet or a resin film including hardening resin. Such sealing resin can easily cover a wide area as explained above. Therefore, it is possible to increase the number of semiconductor elements that can be covered with the sealing resin. The sealing resin 116 desirably includes not only the sealing resin but also a filler. The filler is not specifically limited as long as the filler is a filler contained in the sealing resin. Examples of the filler include an inorganic filler such as inorganic particulates and organic particulates. The inorganic filler is desirable as the filler. In other words, the sealing resin 116 is more desirably a resin sheet or a resin film including the hardening resin and the inorganic filler. With such sealing resin, it is possible to suppress occurrence of a warp between an obtained insulating layer and other insulating layers, semiconductor elements, and the like. This is considered to be because it is possible to approximate, with the contained inorganic filler, a coefficient of thermal expansion with coefficients of thermal expansion of the other insulating layers, semiconductor elements, and the like. Consequently, it is desirable to use, as the sealing resin 116, the resin sheet or the resin film including the hardening resin and the inorganic filler in terms of heat resistance, a low warp of a molded product, and a reduction in thermal linear expansion. Examples of the hardening resin included in the sealing resin 116 include thermosetting resin such as epoxy resin, acrylic resin, polycarbonate resin, polyimide resin, polyphenylene sulfide resin, polyphenylene ether resin, cyanate resin, benzoxazine resin, and bismaleimide resin. The inorganic filler included in the sealing resin 116 is not specifically limited as long as the inorganic filler is an inorganic filler, the coefficient of thermal expansion of which can be adjusted to match coefficients of thermal expansion of the other insulating layers, semiconductor elements, and the like. Examples of the inorganic filler include inorganic particulates such as silica particulates. The organic particulates included in the sealing resin 116 are not specifically limited as long as the organic particulates are organic particulates, a coefficient of thermal expansion can be adjusted to match the coefficients of thermal expansion of the other insulating layers, semiconductor elements, and the like. Examples of the organic particulates include rubber particulates. The base material 117 is not specifically limited as long as the base material 117 is a base material, the shape of which can be maintained by pressing of the resin sheet or resin film 115. Specifically, examples of the base material 117 include an organic substrate such as a PET substrate, a glass substrate, and a metal plate such as a SUS plate.

Finally, as shown in FIG. 4C, the sealing resin 116 is hardened to form the covering insulating layer 126. A condition for hardening the sealing resin 116 is not specifically limited. If the hardening resin included in the sealing resin 116 is thermosetting resin, the condition only has to be a heating condition under which the resin can be hardened. This step is equivalent to the hardening step. Thereafter, when the sealing resin 116 is formed, if the resin sheet or resin film 115 is used, the base material 117 is separated. Consequently, the covering insulating layer 126 is formed.

It is possible to easily perform the covering step by applying such a covering step as the covering step. Therefore, it is possible to easily perform the manufacturing method for a semiconductor package according to this embodiment. As shown in FIG. 4C, the covering insulating layer 126 includes both of a sealing layer that covers electrodes of a semiconductor element and a wiring layer that forms a wire.

The covering step including the hardening step of forming the covering insulating layer is performed in a state in which the semiconductor element is stuck to the supporting body and the position of the semiconductor element is retained. Therefore, it is possible to suppress occurrence of a shift of the semiconductor element. The covering step including the hardening step of forming the covering insulating layer is performed in a state in which the semiconductor element is stuck to the supporting body. Therefore, it is possible to suppress, with the presence of the supporting body, a warp from occurring in a structure in which the semiconductor element is covered with the covering insulating layer.

A fourth embodiment of the present invention is explained.

Examples of a manufacturing method for a semiconductor package according to this embodiment include a manufacturing method in which the covering step is a step of forming, as the covering insulating layer, a covering insulating layer having projections of a predetermined shape on the surface of the semiconductor element on the electrodes side and the circuit pattern-forming step is a step of forming, as the circuit groove, a circuit groove reaching the surfaces of the projections and coupled to the recesses. Specifically, the manufacturing method for a semiconductor package according to the fourth embodiment of the present invention includes a covering step of forming a covering insulating layer that covers to embed a semiconductor element including electrodes on the principal plane thereof and has projections of a predetermined shape on the surface of the semiconductor element on the electrodes side, a film-forming step of forming a resin film on the surface of the covering insulating layer on the electrodes side of the semiconductor element, a circuit pattern-forming step of forming a circuit pattern portion including recesses reaching the surfaces of the electrodes and a circuit groove having a desired shape and a desired depth reaching the projections, by applying laser processing or embossing to the covering insulating layer from an outer surface side of the resin film, a catalyst-depositing step of depositing a plating catalyst or a precursor thereof on the surface of the circuit pattern portion and the surface of the resin film, a film-separating step of separating the resin film from the covering insulating layer, and a plating processing step of forming a circuit electrically connected to the electrodes and reaching the projections, by applying electroless plating to the covering insulating layer, from which the resin film is separated. With such a manufacturing method, as explained above, it is possible to highly accurately perform the formation of a circuit on the insulating layer (the covering insulating layer) that covers the semiconductor element and the formation of vias for electrically connecting the circuit and the electrodes of the semiconductor element. Further, it is more highly accurately perform the formation of the vias and the circuit by forming bumps such as solder ball bumps on the circuit formed on the projections. In short, the semiconductor package is summarized as explained below.

In the obtained semiconductor package, the projections such as resin bumps are formed on the surface side of the covering insulating layer on which the circuit is formed. In other words, the projections are formed in a re-wiring layer. In the semiconductor package, re-wires are formed on the projections as well. It is possible to narrow an inter-bump pitch by mounting the bumps on the projections. In other words, when the semiconductor package and the substrate are electrically connected, it is possible to perform bump connection at a narrow pitch by connecting the semiconductor package and the substrate via the bumps mounted on the projections.

FIGS. 5A to 5L are schematic sectional views for explaining steps in the manufacturing method for a semiconductor package according to the embodiment of the present invention.

First, as shown in FIGS. 5A to 5G, a covering insulating layer 222 is formed that covers to embed a semiconductor element 213 including electrodes 213a on the principal plane thereof and has projections 212a of a predetermined shape on the surface of the semiconductor element 213 on an electrodes 213a side. The covering insulating layer 222 is not specifically limited as long as the covering insulating layer 222 is an insulating layer that covers to embed the semiconductor element 213 and has the projections 212a of the predetermined shape on the surface of the semiconductor element 213 on the electrodes 213a side. Specifically, examples of the covering insulating layer 222 include a covering insulating layer that includes a fifth insulating layer 212 and a sixth insulating layer 215 and in which the fifth insulating layer 212 is an insulating layer having the projections 212a of the predetermined shape as shown in FIG. 5G. The projections 212a are not specifically limited. Examples of the projections 212a include projections functioning as bases for forming a circuit 220b on the projections 212a and forming solder bumps 221 on the circuit 220b as explained below. In other words, examples of the projections 212a include projections in which a structure including the projections 212a, the circuit 220b, and the solder bumps 221 functions as bumps for connecting the semiconductor element 213. This step is equivalent to the covering step. The covering step is explained below.

Subsequently, as shown in FIG. 5H, a resin film 217 is formed on the surface of the covering insulating layer 222 on the electrodes 213a side of the semiconductor element 213. The surface of the covering insulating layer 222 on the electrodes 213a side of the semiconductor element 213 is the surface of the fifth insulating layer 212 that covers the electrodes 213a of the semiconductor element 213 among the surfaces of the covering insulating layer 222. This step is equivalent to the film-forming step.

Subsequently, as shown in FIG. 5I, laser processing or embossing is applied to the covering insulating layer 222 from the outer surface side of the resin film 217, whereby a circuit pattern portion 218 including recesses 218a reaching the surfaces of the electrodes 213a and circuit grooves 218b having a desired shape and a desired depth reaching the projections 212a is formed. As a part of the circuit grooves 218b, recesses for forming a through-hole or a land portion for securing electrical connection to other electronic components may be formed. A portion where an electroless plating film is formed by electroless plating, i.e., a portion where an electric circuit is formed is defined by the circuit pattern portion 218. The laser processing or the embossing for forming the recesses 218a is boring machining for exposing the electrodes 218a. The laser processing or the embossing for forming the circuit grooves 218b is machining for cutting the circuit grooves 218b exceeding the thickness of the resin film 217 with reference to the outer surface of the resin film 217. This step is equivalent to the circuit pattern-forming step.

Subsequently, as shown in FIG. 5J, a plating catalyst or a precursor 219 thereof is deposited on the surface of the circuit pattern portion 218 and the surface of the resin film 217. This step is equivalent to the catalyst-depositing step.

Subsequently, as shown in FIG. 5K, the resin film 217 remaining after the circuit pattern portion 218 is formed is separated (peeled) from the surface of the covering insulating layer 222, specifically, the surface of the fifth insulating layer 212 that covers the electrodes 213a of the semiconductor element 213. Consequently, the plating catalyst or the precursor 219 thereof can be left only in the circuit patter section 218 of the fifth insulating layer 212. In other words, the plating catalyst or a precursor 219a thereof corresponding to the positions of the recesses 218a can be left in the recesses 218a. The plating catalyst or a precursor 219b corresponding to the position of the circuit grooves 218b can be left in the circuit grooves 218b. On the other hand, the plating catalyst or the precursor thereof deposited on the surface of the resin film 217 is removed together with the resin film 217 in a state in which the plating catalyst or the precursor is born on the resin film 217. This step is equivalent to the film-separating step.

Subsequently, electroless plating is applied to the fifth insulating layer 212 of the covering insulating layer 222 from which the resin film 217 is separated. Consequently, as shown in FIG. 5L, a circuit electrically connected to the electrodes 213a of the semiconductor element 213 and reaching the projections 212a is formed. In other words, electroless plating films 220a corresponding to the positions of the recesses 218a and electroless plating films 220b corresponding to the positions of the circuit grooves 218b are formed. The electroless plating films 220b corresponding to the positions of the circuit grooves 218b are formed on the projections 212a of the fifth insulating layer 212 as well. This step is equivalent to the plating processing step.

The electroless plating films 220b corresponding to the positions of the circuit grooves 218b formed by the electroless plating may be directly formed as electric circuits. The electroless plating films 220b do not have to be directly formed as electric circuits. In that case, electroless plating (fill-up plating) may be further applied to the electroless plating films 220b to form an electric circuit.

The electroless plating films 220a formed by the electroless plating and corresponding to the positions of the recesses 218a may be formed as vias for securing electrical connection between the electroless plating film 220b and the electrodes 213a of the semiconductor element 213 or do not have to be directly formed as vias. When the electroless plating films 220a cannot be directly formed as vias, electroless plating (fill-up plating) only has to be applied to the electroless plating films 220a to be formed as vias.

With such a manufacturing method, it is possible to highly accurately perform the formation of the circuit 220b on the fifth insulating layer 212 of the covering insulating layer 222 that covers the semiconductor element 213 and the formation of the vias for electrically connecting the circuits 220b and the electrodes 213a of the semiconductor element 213.

The manufacturing method for a semiconductor package according to this embodiment may be a manufacturing method for forming one layer of a re-wired circuit or may be a manufacturing method for forming two or more layers as shown in FIGS. 5A to 5L. Specifically, as shown in FIG. 5L, after the electric circuits are formed, the steps may be applied again to form two or more layers of re-wired circuits.

Finally, when there are two or more semiconductor elements 213, the semiconductor elements adjacent to each other may be cut to form semiconductor packages. One semiconductor element may be formed in each of the semiconductor packages obtained by cutting the semiconductor elements as explained above. However, the number of semiconductor elements is not limited to this. For example, each of the semiconductor packages may include two or more semiconductor elements. When the semiconductor package includes the two or more semiconductor elements, the semiconductor elements may be semiconductor elements having the same kind of function or may be semiconductor elements having different kinds of functions.

As shown in FIG. 6, it is desirable to form the solder bumps 221 on the circuits 220b formed on the projections 212a. Consequently, it is possible to more highly accurately perform the formation of the vias and the circuits. This is considered to be because it is possible to reduce an amount of solder for securing electrical connection between the semiconductor element and other electronic components. In other words, it is considered to be possible to secure the electrical connection between the semiconductor element and the other electronic components even if the amount of solder of the solder bumps is reduced in order to, for example, narrow a pitch of the solder bumps. Consequently, it is considered to be possible to suppress occurrence of a solder bridge due to coupling of the solder bumps adjacent to each other and therefore suppress occurrence of electrical short circuit due to the solder bridge. Consequently, it is considered to be possible to more highly accurately perform the formation of the vias and the circuits. FIG. 6 is a schematic sectional view schematically showing a semiconductor package obtained by the manufacturing method for a semiconductor package according to the embodiment of the present invention. In the semiconductor package, the solder bumps 221 are formed. In short, the semiconductor package is summarized as explained below.

In the obtained semiconductor package, the projections such as resin bumps are formed on the surface side of the covering insulating layer on which the circuits are formed. In other words, the projections are formed in a re-wiring layer. In the semiconductor package, re-wires are formed on the projections as well. The solder bumps or the like are mounted on the projections. Further, concerning amounting of the semiconductor package on an electronic component such as a circuit board, the semiconductor package is connected via the bumps mounted on the projections. The solder bumps are formed on the projections such as the resin bumps as explained above. Therefore, an amount of solder of the solder bumps may be smaller by the height of the projections than an amount of solder in forming the solder bumps on a surface on which the projections are not formed, i.e., a plane. Consequently, it is possible to reduce the size of the solder bumps. In other words, it is possible to realize electrical connection between the electronic component and the semiconductor package by connecting the bumps at the narrow pitch. This also contributes to improvement of connection reliability. Further, since circuit patterns can be formed on side surface of the resin bumps, which are the projections, as well, it is possible to form wires at high density.

A semiconductor device of a so-called multilayer structure is obtained by forming, on the semiconductor package, wiring layers including circuits electrically connected to the circuits of the semiconductor package. In other words, a semiconductor device is obtained that includes the semiconductor package and includes one or more wiring layers including circuits electrically connected to the circuits of the semiconductor package.

As shown in FIG. 5L, the circuit 220b is desirably formed, with respect to the surface of the fifth insulting layer 212 of the covering insulating layer 222, on the outer side of the outer edge of the shape of the semiconductor element 213 projected in a direction orthogonal to the principal plane of the semiconductor element 213. In other words, the circuit 220b is desirably formed wide exceeding the width of the semiconductor element 213. Consequently, electrical connection to the other electronic components is easily secured. When a semiconductor device of the multilayer structure is manufactured, electrical connection to circuits of wiring layers is easily secured.

The covering step is explained.

The covering step is not specifically limited as long as the covering step is a step that can cover to embed the semiconductor element 213 and form, on the surface of the semiconductor element 213 on the electrodes 213a side, the covering insulating layer 222 including the projections 212a of the predetermined shape. Specifically, examples of the covering step include a step explained below.

An example of the covering step in the manufacturing method for a semiconductor package according to this embodiment is explained.

Specifically, examples of the covering step include a step including a fifth insulating layer-forming step of forming a fifth insulating layer on the surface of a supporting body including recesses corresponding to the projections, a sticking step of sticking at least one or more of the semiconductor elements to the fifth insulating layer such that the surfaces of the semiconductor elements on which the electrodes are formed come into contact with the fifth insulating layer, a sealing resin-covering step of covering the semiconductor element stuck to the fifth insulating layer with sealing resin such that the semiconductor elements are embedded, a hardening step of hardening the sealing resin and forming a sixth insulating layer to thereby form the covering insulating layer, and a supporting body-separating step of separating the supporting body from the covering insulating layer.

First, as shown in FIGS. 5A and 5B, the fifth insulating layer 212 is formed on the surface of a supporting body 211 including recesses 211a corresponding to the projections 212a. The formation of the fifth insulating layer 212 is not specifically limited as long as the fifth insulating layer 212 to which the shape of the recesses 211a of the supporting body 211 is transferred can be formed on the supporting body 211. This step is equivalent to the fifth insulating layer-forming step.

The supporting body 211 is not specifically limited as long as the supporting body 211 is a supporting body including the recesses 211a corresponding to the projections 212a. Examples of the supporting body 211 include a metal plate such as a stainless steel (SUS) plate on which the recesses 211a are formed by etching treatment and an organic substrate on which the recesses 211a are formed by the etching treatment. The supporting body 211 may be a supporting body subjected to release treatment on the surface or a base material applied with a coating agent having releasability on the surface in order to increase releasability from the fifth insulating layer 212.

The fifth insulating layer 212 is not specifically limited as long as the fifth insulating layer 212 is an insulating layer, on the surface of which the semiconductor element can be stuck in the sticking step. Examples of the fifth insulating layer 212 include a resin layer. Specifically, examples of resin forming the resin layer include epoxy resin, acrylic resin, polycarbonate resin, polyimide resin, polyphenylene sulfide resin, polyphenylene ether resin, cyanate resin, benzoxazine resin, bismaleimide resin, phenol resin, and benzocyclobutene resin. The fifth insulating layer 212 desirably includes not only the resin but also a filler. Consequently, it is possible to suppress occurrence of a warp between an obtained insulating layer and other insulating layers, semiconductor elements, and the like. This is considered to be because it is possible to approximate, with the contained filler, a coefficient of thermal expansion thereof with the coefficients of thermal expansion of the other insulating layers, semiconductor elements, and the like. The filler is not specifically limited. Examples of the filler include an inorganic filler such as inorganic particulates and organic particulates. The inorganic filler is desirable as the filler. The inorganic filler included in the fifth insulating layer 212 is not specifically limited as long as the inorganic filler is an inorganic filler, the coefficient of thermal expansion of which can be adjusted to match the coefficients of thermal expansion of the other insulating layers, semiconductor elements, and the like. Examples of the inorganic filler include inorganic particulates such as silica particulates. The organic particulates included in the fifth insulating layer 212 are not specifically limited as long as the organic particulates are organic particulates that can relax stress generated during heating because of a difference between a coefficient of thermal expansion thereof and the coefficients of thermal expansion of the other insulating layers, semiconductor elements, and the like. Examples of the organic particulates include rubber particles.

Subsequently, as shown in FIG. 5C, at least one or more semiconductor elements 213 are stuck to the fifth insulating layer 212 such that the surfaces of the semiconductor elements 213 on which the electrodes 213a are formed come into contact with the fifth insulating layer. This step is equivalent to the sticking step.

Subsequently, as shown in FIGS. 5D and 5E, the semiconductor element 213 stuck to the fifth insulating layer 212 is covered with the sealing resin 215 to be embedded. This step is equivalent to the sealing resin-covering step. The sealing resin-covering step may be a step of coating sealing resin. However, as shown in FIGS. 5D and 5E, a step of covering the semiconductor element 213 with a resin sheet or resin film 214 including sealing resin 215 and a base material 216 that supports the sealing resin 215, and pressing the resin sheet or resin film 214 such that the semiconductor element 213 stuck to the fifth insulating layer 212 is covered with the sealing resin 215 so as to be embedded is desirably used. When such a resin sheet or resin film 214 is used, since a wide area can be easily covered, it is possible to increase the number of semiconductor elements that can be covered. In other words, it is possible to increase the number of semiconductor packages that can be simultaneously manufactured. The usage of the resin sheet or resin film 214 is also desirable in that, for example, in manufacturing in a large size, a first insulating layer to be formed secures thickness accuracy in a work surface. The sealing resin is not specifically limited, i.e., not limited to such a resin sheet or resin film. For example, a powder sealing material or a liquid sealing material can be used. The powder sealing material or the liquid sealing material can be used as sealing resin when the sealing resin-covering step is performed by in the step of coating the sealing resin.

The sealing resin 215 is not specifically limited as long as the sealing resin 215 is sealing resin from which an insulating layer can be formed by hardening or the like after covering to embed the semiconductor element 213 stuck to the fifth insulating layer 212. Specifically, examples of the sealing resin 215 include sealing resin from which the sixth insulating layer 215 shown in FIG. 5F can be formed by hardening or the like. The sealing resin 215 is desirably a resin sheet or a resin film including hardening resin. Such sealing resin can easily cover a wide area as explained above. Therefore, it is possible to increase the number of semiconductor elements that can be covered with the sealing resin. The sealing resin 215 desirably includes not only the sealing resin but also a filler. The filler is not specifically limited as long as the filler is a filler contained in the sealing resin. Examples of the filler include an inorganic filler such as inorganic particulates and organic particulates. The inorganic filler is desirable as the filler. In other words, the sealing resin 215 is more desirably a resin sheet or a resin film including the hardening resin and the inorganic filler. With such sealing resin, it is possible to suppress occurrence of a warp between an obtained insulating layer and other insulating layers, semiconductor elements, and the like. This is considered to be because it is possible to approximate, with the contained inorganic filler, a coefficient of thermal expansion thereof with the coefficients of thermal expansion of the other insulating layers, semiconductor elements, and the like. Consequently, it is desirable to use, as the sealing resin 215, the resin sheet or the resin film including the hardening resin and the inorganic filler in terms of heat resistance, a low warp of a molded product, and a reduction in thermal linear expansion. Examples of the hardening resin included in the sealing resin 215 include thermosetting resin such as epoxy resin, acrylic resin, polycarbonate resin, polyimide resin, polyphenylene sulfide resin, polyphenylene ether resin, cyanate resin, benzoxazine resin, and bismaleimide resin. The inorganic filler included in the sealing resin 15 is not specifically limited as long as the inorganic filler is an inorganic filler, the coefficient of thermal expansion of which can be adjusted to match the coefficients of thermal expansion of the other insulating layers, semiconductor elements, and the like. Examples of the inorganic filler include inorganic particulates such as silica particulates. The organic particulates included in the sealing resin 215 are not specifically limited as long as the organic particulates are organic particulates that can relax stress generated during heating because of a difference between a coefficient of thermal expansion thereof and the coefficients of thermal expansion of the other insulating layers, semiconductor elements, and the like. Examples of the organic particulates include rubber particles. The base material 216 is not specifically limited as long as the base material 216 is a base material, the shape of which can be maintained by pressing of the resin sheet or resin film 224. Specifically, examples of the base material 216 include an organic substrate such as a PET substrate, a glass substrate, and a metal plate such as a SUS plate. The substrate 216 may be a base material subjected to release treatment on the surface or may be a base material applied with a coating agent having releasability on the surface in order to increase releasability from the sealing resin 215.

Subsequently, the sealing resin 215 is hardened to form the sixth insulating layer 215. Consequently, the covering insulating layer 222 including the fifth insulating layer 212 and the sixth insulating layer 215 is formed. A condition for hardening the sealing resin 215 is not specifically limited. If the hardening resin included in the sealing resin 215 is thermosetting resin, the condition only has to be a heating condition under which the resin can be hardened. This step is equivalent to the hardening step. Thereafter, as shown in FIG. 5F, the base material 216 of the resin sheet or resin film 214 may be separated. The base material 216 does not have to be separated or may be separated after the supporting body-separating step.

Finally, as shown in FIG. 5G, the supporting body 211 is separated (peeled) from the fifth insulating layer 212 of the covering insulating layer 222. Consequently, the covering insulating layer 222 is formed. This step is equivalent to the supporting body-separating step.

It is possible to easily perform the covering step by applying such a covering step as the covering step. In other words, it is possible to easily form a covering insulating layer including predetermined projections. Therefore, it is possible to easily perform the manufacturing method for a semiconductor package according to this embodiment.

In a state in which the semiconductor element 213 is stuck to one insulating layer-forming the covering insulating layer 222, specifically, to the fifth insulating layer 212, the sixth insulating layer 215, which is the other insulating layer, is formed to form the covering insulating layer 222. Therefore, it is possible to suppress occurrence of a shift of the semiconductor element 213. The covering step is performed in a state in which the semiconductor element 213 is fixed to the fifth insulating layer 212. Therefore, it is possible to suppress, with the presence of the fifth insulating layer 212, a warp from occurring in a structure in which the semiconductor element is covered with the covering insulating layer.

The steps other than the covering step in the manufacturing methods according to the embodiments of the present invention are explained below.

<Film-Forming Step>

As explained above, the film-forming step is a step of forming a resin film on the surface of a covering insulating layer on an electrodes side of a semiconductor element.

(Resin Film)

The resin film is not specifically limited as long as the resin film is a resin film that can be separated (peeled) and removed in the film-separating step. Specifically, examples of the resin film include soluble resin that can be easily dissolved by an organic solvent or an alkali solution and a swelling resin film made of resin that can swell with predetermined liquid (swelling liquid) explained later. Among the resin films, the swelling resin film is particularly desirable in that accurate removal is easy. In the swelling resin film, for example, a swelling degree with respect to the liquid (the swelling liquid) is 50% or more. The swelling resin film includes not only a resin film that is substantially not dissolved in the liquid (the swelling liquid) and is easily separated from the surface of the covering insulating layer but also a resin film that swells in the liquid (the swelling liquid) and is at least partially dissolved and easily separated from the surface of the covering insulating layer by the swelling and the dissolution and a resin film that is dissolved in the liquid (the swelling liquid) and easily separated from the surface of the covering insulating layer by the dissolution.

A forming method for the resin film is not specifically limited. Specifically, examples of the forming method include a method of coating a liquid material, from which the resin film can be formed, on the surface of the covering insulating layer and then drying the liquid material and a method of transferring, onto the surface of the covering insulating layer, a resin film formed by applying a liquid material to a supporting substrate and then drying the liquid material. The method of coating the liquid material is not specifically limited. Specifically, examples of the method include a spin coat method and a bar coater method known in the past.

The thickness of the resin film is desirably equal to or smaller than 10 micrometer and more desirably equal to or smaller than 5 micrometer. On the other hand, the thickness of the resin film is desirably equal to or larger than 0.1 micrometer and more desirably equal to or larger than 1 micrometer. When the thickness of the resin film is too large, accuracy of the circuit groove, the recesses, and the like formed by the laser processing or the embossing in the circuit pattern-forming step tends to be deteriorated. When the thickness of the resin film is too small, the resin film having uniform thickness tends to be less easily formed.

A preferred swelling resin film is explained as an example of the resin film.

As the swelling resin film, a resin film having a swelling degree equal to or higher than 50% with respect to the swelling liquid is desirably used. Further, a resin film having a swelling degree equal to or higher than 100% with respect to the swelling liquid is more desirable. When the swelling degree is too low, the swelling resin film tends to be less easily separated in the film-separating step.

A forming method for the swelling resin film is not specifically limited and only has to be a method same as the forming method for the resin film. Specifically, examples of the forming method include a method of coating a liquid material, from which the swelling resin film can be formed, on the surface of the covering insulating layer and then drying the liquid material and a method of transferring, onto the surface of the covering insulating layer, a swelling resin film formed by applying a liquid material to a supporting substrate and then drying the liquid material.

Examples of the liquid material from which the swelling resin film can be formed include a suspension and an emulsion of elastomer. Specific examples of the elastomer include dien elastomer such as a styrene-butadiene copolymer, acrylic elastomer such as an acrylic ester copolymer, and polyester elastomer. With such elastomer, it is possible to easily form a swelling resin film having a desired swelling degree by adjusting a degree of crosslinking, a degree of gelation, or the like of elastomer resin particles dispersed as the suspension or the emulsion.

Examples of the resin film include a resin film made of (a) at least one or more kinds of monomers of carboxylic acid or acid anhydride having at least one polymeric unsaturated radial in a molecule and (b) polymer resin obtained by polymerizing at least one or more kinds of monomers that can be polymerized with the monomer (a) or a resin composition including the polymer resin.

Examples of (a) include (meta) acrylic acid, fumaric acid, cinnamic acid, crotonic acid, itaconic acid, maleic anhydride, maleic half ester, and butyl acrylate. Any one of the substances may be used alone or two or more kinds of the substances may be combined.

As an example of (b), polymer resin or a resin composition that is non-acidic and includes (one) polymeric unsaturated radical in a molecule is generally used but is not limited thereto. The polymer resin or the resin composition is selected to maintain various characteristics such as resistance in the plating step and flexibility of the hardening film. Specifically, examples of (b) include methyl (meta) acrylate, ethyl (meta) acrylate, iso-propyl (meta) acrylate, n-butyl (meta) acrylate, sec-butyl (meta) acrylate, tert.-butyl (meta) acrylate, 2-hydroxyl ethyl (meta) acrylate, and 2-hydroxyl propyl (meta) acrylates. Further, the examples include esters of vinyl alcohol such as vinyl acetate, (meta) crylonitrile, and styrene or polymerizable styrene derivative. The polymer resin or the resin composition can be obtained by polymerization of only carboxylic acid or acid anhydride including one polymeric unsaturated radical in a molecule. Further, it is possible to select a monomer including a plurality of unsaturated radicals as the monomer used for the polymer and introduce a reactive functional group such as an epoxy group, a hydroxyl group, an amino group, an amide group, or a vinyl group into a molecular framework such that three-dimensional crosslinking can be performed.

The swelling resin film is particularly desirably a film, a swelling degree of which changes depending on pH of the swelling liquid. When such a film is used, a humoral condition in the catalyst-depositing step and a humoral condition in the film-separating step are set different, whereby the swelling resin film maintains high adhesion to the covering insulating layer at pH in the catalyst-depositing step and the swelling resin film can be easily separated at pH in the film-separating step.

More specifically, for example, when the catalyst-depositing step includes, for example, a step of treatment in an acid plating catalyst colloid solution (an acid catalyst metal colloid solution) in a range of pH 1 to 3 and the film separating step includes a step swelling the swelling resin film in an alkali solution in a range of pH 12 to 14, the swelling resin film is desirably a resin film having a swelling degree lower than 50% or equal to or smaller than 40% with respect to the acid plating catalyst colloid solution and having a swelling degree equal to or higher than 50%, equal to or higher than 100%, or equal to or higher than 500% with respect to the alkali solution.

Examples of such a swelling resin film include a sheet formed of elastomer having a predetermined amount of carboxyl group, a sheet obtained by entirely hardening photo-curing resist of an alkali development type used in dry film resist (hereinafter referred to as DFR) for patterning of a printed wiring board, and a thermosetting or alkali development type sheet.

<Circuit Pattern-Forming Step>

The circuit pattern-forming step is a step of forming the circuit pattern portion, specifically, the circuit pattern portion including the recesses reaching the surfaces of the electrodes and the circuit groove having the desired shape and the desired depth by applying laser processing or embossing to the covering insulating layer (the second insulating layer, the fifth insulating layer, etc.) from the outer surface side of the resin film.

A method of forming the circuit pattern portion is not specifically limited. Specifically, examples of the method include laser processing, cutting such as dicing, and machining such as embossing. When a high precision micro circuit is formed, it is desirable to use the laser processing. With the laser processing, it is possible to freely adjust cutting depth and the like by changing an output and the like of a laser. As the embossing, for example, embossing by a micro resin mold used in the field of nano-imprint is desirably used.

<Catalyst-Depositing Step>

The catalyst-depositing step is a step of a plating catalyst or a precursor thereof on the surface of the circuit pattern portion and the surface of the resin film on which the circuit pattern portion is not formed.

The plating catalyst or the precursor thereof is a catalyst given to form an electroless plating film only in a portion where the electroless plating film is desired to be formed by electroless plating in the plating processing step. As the plating catalyst, a plating catalyst known as a catalyst for the electroless plating can be used without being specifically limited. The precursor of the plating catalyst may be deposited in advance and the plating catalyst may be generated after removal of the resin film. Specific examples of the plating catalyst include metal palladium (Pd), platinum (Pt), and silver (Ag) or a precursor for generating these kinds of metal.

Examples of a method of depositing the plating catalyst or the precursor 16 thereof include a method of treating the plating catalyst or the precursor 16 with an acid Pd—Sn colloid solution treated under an acid condition of pH 1 to 3 and then treating the plating catalyst or the precursor 16 with an acid solution. Specifically, the examples include a method explained below.

First, oil and the like adhering to the surface of the covering insulating layer on which the circuit pattern portion is formed are rinsed for a predetermined time in a solution of a surface active agent (a cleaner conditioner). Subsequently, according to necessity, the covering insulating layer is subjected to soft etching with a sodium persulfate-sulfic acid-based soft etching agent. The covering insulating layer is further acid-cleaned in a sulfic acid aqueous solution, a hydrochloric acid aqueous solution, or the like of pH 1 to 2. Subsequently, the covering insulating layer is immersed in pre-dip liquid containing, as a main component, a tin dichloride aqueous solution or the like having density of 0.1% and pre-dip treatment for absorbing chloride ions to the surface of the covering insulating layer is performed. Thereafter, the covering insulating layer is further immersed in an acid plating catalyst colloid solution of acid Pd—Sn colloid of pH 1 to 3 containing tin dichloride and palladium chloride, whereby Pd and Sn are condensed and absorbed. An oxidation-reduction reaction

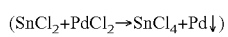

is caused between the absorbed tin dichloride and the absorbed palladium chloride. Consequently, metal palladium, which is the metal catalyst, is separated out.

As the acid plating catalyst colloid solution, a publicly-known acid Pd—Sn colloid catalyst solution or the like can be used. A commercially available plating process performed using the acid plating catalyst colloid solution may be used. Such a process is systemized and sold by, for example, Rohm and Haas company.

By such catalyst-depositing treatment, the plating catalyst or the precursor thereof can be deposited on the surface of the circuit pattern portion and the surface of the resin film on which the circuit pattern portion is not formed.

<Film-Separating Step>

The film-separating step is a step of separating (peeling), from the surface of the covering insulating layer, the resin film remaining after the circuit pattern portion is formed.

A method of separating the resin film is not specifically limited. Specifically, examples of the method include a method of swelling the resin film with a predetermined solution (swelling liquid) and then separating the resin film from the covering insulating layer, a method of swelling the resin film with the predetermined solution (swelling liquid) and dissolving a part of the resin film and then separating the resin film from the covering insulating layer, and a method of dissolving the resin film with the predetermined solution (swelling liquid) and removing the resin film. The swelling liquid is not specifically limited as long as the swelling liquid is swelling liquid that can swell the resin film. The swelling and the dissolution are performed by, for example, immersing the covering insulating layer covered with the resin film in the swelling liquid for a predetermined time. Removing efficiency may be increased by irradiating ultrasound during the immersion. When the resin film is swelled and separated, the resin film may be separated with light force.

Separating of the swelling resin film used as the resin film is explained.

As liquid (swelling liquid) for swelling the swelling resin film, liquid that can swell or dissolve the swelling resin film without substantially decomposing or dissolving the covering insulating layer and the plating catalyst or the precursor thereof can be used without being specifically limited. Liquid that can swell the swelling resin film to a degree enough for easily Separating is desirable. Such swelling liquid can be selected as appropriate according to the type and the thickness of the swelling resin film.

Examples of a method of swelling the swelling resin film include a method of immersing the swelling resin film in the swelling liquid for a predetermined time. In order to improve peelability, it is particularly desirable to irradiate ultrasound during the immersion. When the swelling resin film is not separated only by the swelling, the swelling resin film may be separated ed with light force according to necessity.

<Plating Processing Step>

The plating processing step is a step of applying electroless plating to the covering insulating layer (the second insulating layer, the fifth insulating layer, etc.) from which the resin film is separated.

As a method of electroless plating processing, it is possible to use a method of immersing the covering insulating layer, on which the plating catalyst or the precursor 16 thereof is partially deposited, in electroless plating liquid and separating out an electroless plating film (a plating film) only in a portion where the plating catalyst or the precursor 16 thereof is deposited.

Examples of metal used for the electroless plating include copper (Cu), nickel (Ni), cobalt (Co), and aluminum (Al). Plating containing Cu as a main component among these kinds of metal is desirable in that the plating is excellent in electric conductivity. Plaiting containing Ni is desirable in that the plating is excellent in corrosion resistance and adhesion to solder.

By the plating processing step, the electroless plating film is separated out only in a portion on the surface of the covering insulating layer where the plating catalyst or the precursor 16 thereof remains. Therefore, it is possible to accurately form a conductive layer only in a portion where circuits and vias are desired to be formed. On the other hand, it is possible to suppress the electroless plating film from being separated out in a portion where the circuit pattern portion is not formed. Therefore, even when a plurality of micro circuits having small line width is formed at a narrow pitch interval, an unnecessary plating film does not remain between circuits adjacent to each other. Therefore, it is possible to suppress occurrence of short circuit and occurrence of migration.

This specification discloses the techniques of the various forms as explained above. Main techniques among the techniques are summarized below.

According to an aspect of the present invention, there is provided a manufacturing method for a semiconductor package including a covering step of forming a covering insulating layer that covers the surface of a semiconductor element on which electrodes are formed, the semiconductor element including the electrodes on the principal plane thereof, a film-forming step of forming a resin film on the surface of the covering insulating layer on the electrodes side of the semiconductor element, a circuit pattern-forming step of forming a circuit pattern portion including recesses reaching surfaces of the electrodes and a circuit groove having a desired shape and a desired depth, by applying laser processing or embossing to the covering insulating layer from an outer surface side of the resin film, a catalyst-depositing step of depositing a plating catalyst or a precursor thereof on the surface of the circuit pattern portion and the surface of the resin film, a film-separating step of separating the resin film from the covering insulating layer, and a plating processing step of forming a circuit electrically connected to the electrodes, by applying electroless plating to the covering insulating layer, from which the resin film is separated.

With such a configuration, as explained above, it is possible to provide the manufacturing method for a semiconductor package that can highly accurately perform the formation of a circuit on an insulating layer that covers a semiconductor element and the formation of vias for electrically connecting the circuit and electrodes of the semiconductor element.

In the manufacturing method for a semiconductor package, it is desirable that the covering step is a step of embedding the semiconductor element in the covering insulating layer.

With such a manufacturing method, as explained above, it is possible to highly accurately perform the formation of a circuit on the insulating layer (the covering insulating layer) that covers the semiconductor element and the formation of vias for electrically connecting the circuit and the electrodes of the semiconductor element. Further, since the semiconductor element is embedded in the covering insulating layer, it is possible to further improve reliability concerning the semiconductor element. With such a manufacturing method, as explained above, since a region where the re-wired circuit is formed can be expanded, it is possible to increase the number of output and input terminals.

In the manufacturing method for a semiconductor package, it is desirable that the covering step includes a bonding step of bonding at least one or more of the semiconductor elements in a predetermined position of a supporting body to which the semiconductor elements are detachably attached, a sealing resin-covering step of covering the semiconductor elements bonded to the supporting body with sealing resin such that the semiconductor elements are embedded, a hardening step of hardening the sealing resin and forming a first insulating layer, a supporting body-separating step of separating the supporting body from the semiconductor elements and the first insulating layer, and a second insulating layer-forming step of forming a second insulating layer on surfaces of the semiconductor elements and the first insulating layer with which the supporting body is in contact to thereby form the covering insulating layer including the first insulating layer and the second insulating layer.

With such a configuration, as explained above, it is possible to easily perform the covering step. Therefore, it is possible to easily perform the manufacturing method for a semiconductor package.

In the manufacturing method for a semiconductor package, it is desirable that the supporting body includes a base material and a layer which is provided on at least one surface of the base material and to which the semiconductor elements are detachably attached, and the layer to which the semiconductor elements are detachably attached is an adhesive layer made of silicone resin.

With such a configuration, it is possible to more easily perform the covering step.

In the manufacturing method for a semiconductor package, it is desirable that the covering step includes a bonding step of bonding at least one or more of the semiconductor elements in a predetermined position of a third insulating layer of a supporting body including a base material and the third insulating layer which is provided on at least one surface of the base material and to which the semiconductor elements can be fixed, a sealing resin-covering step of covering the semiconductor elements bonded to the supporting body with sealing resin such that the semiconductor elements are embedded, a hardening step of hardening the sealing resin and forming a fourth insulating layer to thereby form the covering insulating layer including the third insulating layer and the fourth insulating layer, and a base material-separating step of separating the base material from the third insulating layer.

With such a configuration, as explained above, it is possible to easily perform the covering step. Therefore, it is possible to easily perform the manufacturing method for a semiconductor package.

In the manufacturing method for a semiconductor package, it is desirable that the sealing resin is a resin sheet or a resin film including hardening resin and an inorganic filler.

With such a configuration, it is possible to manufacture a semiconductor package with occurrence of a shift and a warp further suppressed.

In the manufacturing method for a semiconductor package, it is desirable that the covering step includes forming, as the covering insulating layer, a covering insulating layer such that a surface of the semiconductor element on an opposite side to the electrodes is exposed.

With such a manufacturing method, as explained above, it is possible to highly accurately perform the formation of a circuit on the insulating layer (the covering insulating layer) that covers the semiconductor element and the formation of vias for electrically connecting the circuit and the electrodes of the semiconductor element. Further, the covering insulating layer is formed such that the surface of the semiconductor element on the opposite side to the electrodes is exposed. Therefore, it is possible to increase heat radiation properties of the semiconductor layer and reduce the thickness of the covering insulating layer. With such a manufacturing method, as explained above, since a region where the re-wired circuit is formed can be expanded, it is possible to increase the number of output and input terminals.

In the manufacturing method for a semiconductor package, it is desirable that the covering step includes a sticking step of sticking at least one or more of the semiconductor elements to a supporting body such that surfaces of the semiconductor elements on an opposite side to the electrodes come into contact with predetermined positions of the supporting body, a sealing resin-covering step of covering, with sealing resin, the surfaces on which the electrodes are formed of the semiconductor elements stuck to the supporting body, and a hardening step of hardening the sealing resin and forming the covering insulating layer.

With such a configuration, as explained above, it is possible to easily perform the covering step. Therefore, it is possible to easily perform the manufacturing method for a semiconductor package.

In the manufacturing method for a semiconductor package, it is desirable that the supporting body is a supporting body to which the semiconductor elements are detachably attached, and the manufacturing method further includes, after the covering step, a supporting body-separating step of separating the supporting body.

With such a configuration, as explained above, it is possible to manufacture a semiconductor package with high heat radiation properties.

In the manufacturing method for a semiconductor package, it is desirable that the supporting body includes a base material and a layer which is provided on at least one surface of the base material and to which the semiconductor elements are detachably attached, and the layer to which the semiconductor elements are detachably attached is an adhesive layer made of silicone resin.

With such a configuration, it is possible to more easily perform the covering step.

In the manufacturing method for a semiconductor package, it is desirable that the sealing resin is a resin sheet or a resin film including hardening resin and an inorganic filler.

With such a configuration, it is possible to manufacture a semiconductor package with occurrence of a shift and a warp further suppressed.

In the manufacturing method for a semiconductor package, it is desirable that the covering step includes forming, as the covering insulating layer, a covering insulating layer having projections of a predetermined shape on the surface of the semiconductor element on the electrodes side, and the circuit pattern-forming step includes forming, as the circuit groove, a circuit groove reaching the surfaces of the projections and coupled to the recesses.

With such a manufacturing method, as explained above, it is possible to highly accurately perform the formation of a circuit on the insulating layer (the covering insulating layer) that covers the semiconductor element and the formation of vias for electrically connecting the circuit and the electrodes of the semiconductor element. In an obtained semiconductor package, the projections such as resin bumps are formed on the surface side of the covering insulating layer on which the circuit is formed. In other words, the projections are formed in a re-wiring layer. In the semiconductor package, re-wires are formed on the projections as well. It is possible to narrow an inter-bump pitch by mounting the bumps on the projections. In other words, when the semiconductor package and the substrate are electrically connected, it is possible to perform bump connection at a narrow pitch by connecting the semiconductor package and the substrate via the bumps mounted on the projections.

In the manufacturing method for a semiconductor package, it is desirable that the covering step includes a fifth insulating layer-forming step of forming a fifth insulating layer on the surface of a supporting body including recesses corresponding to the projections, a sticking step of sticking at least one or more of the semiconductor elements to the fifth insulating layer such that the surfaces of the semiconductor elements on which the electrodes are formed come into contact with the fifth insulating layer, a sealing resin-covering step of covering the semiconductor element stuck to the fifth insulating layer with sealing resin such that the semiconductor elements are embedded, a hardening step of hardening the sealing resin and forming a sixth insulating layer to thereby form the covering insulating layer including the fifth insulating layer and the sixth insulating layer, and a supporting body-separating step of separating the supporting body from the covering insulating layer.

With such a configuration, as explained above, it is possible to easily perform the covering step. Therefore, it is possible to easily perform the manufacturing method for a semiconductor package.

In the manufacturing method for a semiconductor package, it is desirable that the sealing resin is a resin sheet or a resin film including hardening resin and an inorganic filler.

With such a configuration, it is possible to manufacture a semiconductor package with occurrence of a shift and a warp further suppressed.

In the manufacturing method for a semiconductor package, it is desirable that the manufacturing method further includes a step of forming solder bumps on the circuit formed on the projections.

With such a configuration, it is possible to highly accurately perform the formation of vias and circuits. As explained above, this is considered to be because it is possible to suppress occurrence of a solder bridge.

In the manufacturing method for a semiconductor package, it is desirable that the circuit includes a circuit formed, with respect to the surface of the covering insulating layer, on an outer side of an outer edge of a shape of the semiconductor element projected in a direction orthogonal to the principal plane of the semiconductor element.

With such a configuration, it is possible to manufacture a semiconductor package in which it is easy to secure electrical connection to other electronic components and, when a semiconductor device of a multilayer structure is manufactured, it is easy to secure electrical connection to circuits of wiring layers.

According to another aspect of the present invention, there is provided a semiconductor package obtained by the manufacturing method for a semiconductor package.

With such a configuration, it is possible to obtain a semiconductor package in which circuits and vias are accurately formed.

According to still another aspect of the present invention, there is provided a semiconductor device including the semiconductor package and one or more wiring layers including circuits electrically connected to the circuit of the semiconductor package.

With such a configuration, since a semiconductor device is formed in multiple layers using a semiconductor package in which circuits and vias are highly accurately formed. Therefore, it is possible to obtain a suitable semiconductor device with, for example, less failure in electrical connection.

INDUSTRIAL APPLICABILITY

According to the present invention, a manufacturing method for a semiconductor package is provided that can highly accurately perform formation of a circuit on an insulating layer that covers a semiconductor element and formation of vias for electrically connecting the circuit and electrodes of the semiconductor element. Further, a semiconductor package obtained by the manufacturing method and a semiconductor device including the semiconductor package are provided.

The invention claimed is:

1. A manufacturing method for a semiconductor package comprising:
    a covering step of forming a covering insulating layer that covers a surface of a semiconductor element on which electrodes are formed, the semiconductor element including the electrodes on a principal plane thereof;
    a film-forming step of forming a resin film on a surface of the covering insulating layer on the electrodes side of the semiconductor element;
    a circuit pattern-forming step of forming a circuit pattern portion including recesses reaching surfaces of the electrodes and a circuit groove having a desired shape and a desired depth, by applying laser processing or embossing to the covering insulating layer from an outer surface side of the resin film;
    a catalyst-depositing step of depositing a plating catalyst or a precursor thereof on a surface of the circuit pattern portion and a surface of the resin film;
    a film-separating step of separating the resin film from the covering insulating layer; and
    a plating processing step of forming a circuit electrically connected to the electrodes, by applying electroless plating to the covering insulating layer, from which the resin film is separated.

2. The manufacturing method for a semiconductor package according to claim 1, wherein the covering step is a step of embedding the semiconductor element in the covering insulating layer.

3. The manufacturing method for a semiconductor package according to claim 2, wherein the covering step includes:
    a bonding step of bonding at least one or more of the semiconductor elements in a predetermined position of a supporting body to which the semiconductor elements are detachably attached;
    a sealing resin-covering step of covering the semiconductor elements bonded to the supporting body with sealing resin such that the semiconductor elements are embedded;
    a hardening step of hardening the sealing resin and forming a first insulating layer;
    a supporting body-separating step of separating the supporting body from the semiconductor elements and the first insulating layer; and
    a second insulating layer-forming step of forming a second insulating layer on surfaces of the semiconductor elements and the first insulating layer with which the supporting body is in contact to thereby form the covering insulating layer including the first insulating layer and the second insulating layer.

4. The manufacturing method for a semiconductor package according to claim 3, wherein
    the supporting body includes a base material and a layer which is provided on at least one surface of the base material and to which the semiconductor elements are detachably attached, and
    the layer to which the semiconductor elements are detachably attached is an adhesive layer made of silicone resin.

5. The manufacturing method for a semiconductor package according to claim 2, wherein the covering step includes:
    a bonding step of bonding at least one or more of the semiconductor elements in a predetermined position of a third insulating layer of a supporting body including a base material and the third insulating layer which is provided on at least one surface of the base material and to which the semiconductor elements can be fixed;
    a sealing resin-covering step of covering the semiconductor elements bonded to the supporting body with sealing resin such that the semiconductor elements are embedded;
    a hardening step of hardening the sealing resin and forming a fourth insulating layer to thereby form the covering insulating layer including the third insulating layer and the fourth insulating layer; and
    a base material-separating step of separating the base material from the third insulating layer.

6. The manufacturing method for a semiconductor package according to claim 3, wherein the sealing resin is a resin sheet or a resin film including hardening resin and an inorganic filler.

7. The manufacturing method for a semiconductor package according to claim 1, wherein the covering step includes forming, as the covering insulating layer, a covering insulating layer such that a surface of the semiconductor element on an opposite side to the electrodes is exposed.

8. The manufacturing method for a semiconductor package according to claim 7, wherein the covering step includes:
- a sticking step of sticking at least one or more of the semiconductor elements to a supporting body such that surfaces of the semiconductor elements on an opposite side to the electrodes come into contact with predetermined positions of the supporting body;
- a sealing resin-covering step of covering, with sealing resin, the surfaces on which the electrodes are formed of the semiconductor elements stuck to the supporting body; and
- a hardening step of hardening the sealing resin and forming the covering insulating layer.

9. The manufacturing method for a semiconductor package according to claim 8, wherein
the supporting body is a supporting body to which the semiconductor elements are detachably attached, and
the manufacturing method further comprises, after the covering step, a supporting body-separating step of separating the supporting body.

10. The manufacturing method for a semiconductor package according to claim 9, wherein
the supporting body includes a base material and a layer which is provided on at least one surface of the base material and to which the semiconductor elements are detachably attached, and
the layer to which the semiconductor elements are detachably attached is an adhesive layer made of silicone resin.

11. The manufacturing method for a semiconductor package according to claim 8, wherein the sealing resin is a resin sheet or a resin film including hardening resin and an inorganic filler.

12. The manufacturing method for a semiconductor package according to claim 1, wherein
the covering step includes forming a covering insulating layer having projections of a predetermined shape on the surface of the semiconductor element on the electrodes side, and
the circuit pattern-forming step includes forming, as the circuit groove, a circuit groove reaching surfaces of the projections and coupled to the recesses.

13. The manufacturing method for a semiconductor package according to claim 12, wherein the covering step includes:
- a fifth insulating layer-forming step of forming a fifth insulating layer on a surface of a supporting body including recesses corresponding to the projections;
- a sticking step of sticking at least one or more of the semiconductor elements to the fifth insulating layer such that the surfaces of the semiconductor elements on which the electrodes are formed come into contact with the fifth insulating layer;
- a sealing resin-covering step of covering the semiconductor elements stuck to the fifth insulating layer with sealing resin such that the semiconductor elements are embedded;
- a hardening step of hardening the sealing resin and forming a sixth insulating layer to thereby form the covering insulating layer including the fifth insulating layer and the sixth insulating layer; and
- a supporting body-separating step of separating the supporting body from the covering insulating layer.

14. The manufacturing method for a semiconductor package according to claim 13, wherein the sealing resin is a resin sheet or a resin film including hardening resin and an inorganic filler.

15. The manufacturing method for a semiconductor package according to claim 12, further comprising a step of forming solder bumps on the circuit formed on the projections.

16. The manufacturing method for a semiconductor package according to claim 1, wherein the circuit includes a circuit formed, with respect to the surface of the covering insulating layer, on an outer side of an outer edge of a shape of the semiconductor element projected in a direction orthogonal to the principal plane of the semiconductor element.

17. A semiconductor package obtained by the manufacturing method for a semiconductor package according to claim 1.

18. A semiconductor device, comprising:
the semiconductor package according to claim 17; and
one or more wiring layers including circuits electrically connected to the circuit of the semiconductor package.

19. The manufacturing method for a semiconductor package according to claim 5, wherein the sealing resin is a resin sheet or a resin film including hardening resin and an inorganic filler.

* * * * *